US012610631B1

(12) United States Patent
O'Masta et al.

(10) Patent No.: US 12,610,631 B1
(45) Date of Patent: Apr. 21, 2026

(54) MAGNETIC CURVING OF IMAGING SENSORS

(71) Applicant: HRL Laboratories, LLC, Malibu, CA (US)

(72) Inventors: Mark O'Masta, Oak Park, CA (US); Amirfarshad Mashal, Malibu, CA (US); Brian Hempe, Malibu, CA (US); Christian Neuhaus, Malibu, CA (US); Chiaming Chang, Malibu, CA (US); James McWhorter, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 942 days.

(21) Appl. No.: 17/848,352

(22) Filed: Jun. 23, 2022

Related U.S. Application Data

(60) Provisional application No. 63/237,094, filed on Aug. 25, 2021.

(51) Int. Cl.
*H10F 39/00* (2025.01)

(52) U.S. Cl.
CPC ......... *H10F 39/026* (2025.01); *H10F 39/804* (2025.01)

(58) Field of Classification Search
CPC ....... H10F 39/026; H10F 39/80; H10F 39/804
See application file for complete search history.

(56) References Cited

U.S. PATENT DOCUMENTS

| | | | |
|---|---|---|---|
| 8,878,116 B2 * | 11/2014 | Itonaga | H10F 77/50 |
| | | | 438/69 |
| 9,570,488 B2 | 2/2017 | McKnight et al. | |
| 9,870,927 B2 | 1/2018 | Keefe et al. | |
| 10,062,727 B2 | 8/2018 | McKnight et al. | |
| 2006/0186492 A1 * | 8/2006 | Boettiger | H10F 39/809 |
| | | | 257/431 |
| 2008/0113495 A1 | 5/2008 | Ginn et al. | |
| 2021/0313374 A1 | 10/2021 | O'Masta et al. | |

OTHER PUBLICATIONS

Chambion, B. et al., "Tunable curvature of large visible CMOS image sensors: Towards new optical functions and system miniaturization", 2016 IEEE 66th Electronic Components and Technology Conference, 2016, pp. 178-187, IEEE.
Gaschet, C. et al., "Curved sensors for compact high-resolution wide field designs", Proceedings of SPIE 10376, Novel Optical Systems Design and Optimization XX, Aug. 24, 2017, pp. 1037603-1 through 1037603-11, vol. 10376, SPIE.
Gaschet, C. et al., "Methodology to design optical systems with curved sensors", Applied Optics, Feb. 1, 2019, pp. 973-978, vol. 58, No. 4, Optical Society of America.
(Continued)

*Primary Examiner* — Kevin K Pyo
(74) *Attorney, Agent, or Firm* — Lewis Roca Rothgerber Christie LLP

(57) ABSTRACT

A curved detector system and method for fabrication. In some embodiments, the system includes: an optical array detector, and a magnetic substrate coupled to the optical array detector, the optical array detector having a light-sensitive surface, the light-sensitive surface having a curvature of at least 1/m.

20 Claims, 25 Drawing Sheets

(56) References Cited

OTHER PUBLICATIONS

Gregory, J. A. et al., "Development and application of spherically curved charge-coupled device imagers", Applied Optics, Mar. 31, 2015, pp. 3072-3082, vol. 54, No. 10, Optical Society of America.

Guenter, B. et al., "Highly curved image sensors: a practical approach for improved optical performance", Optics Express, Jun. 12, 2017, pp. 13010-13023, vol. 25, No. 12.

Lee, G. J. et al., "Bioinspired Artificial Eyes: Optic Components, Digital Cameras, and Visual Prostheses", Artificial Eyes, Advanced Functional Materials, 2017, 17 pages, vol. 1705202, WILEY-VCH Verlag Gmbh & Co. KGaA, Weinheim.

* cited by examiner

Non-magnetic portion

130

130

130

125

130

130

110

Magnetically responsive layer

110

Separated

110

105

Sensor

Magnetically
responsive layer

In-Plane Array

Out-of-Plane Array

*Magnetic orientation*

FIG. 1G

*Step 1. Press die down*

Membrane

Si/invar laminate

Concave mold

Pressure from top

105

Magnet

210

505

205

*Step 2. Temporarily hold die with magnet*

Curved sample

105

210

205

*Step 3. Transfer to convex mold*

*Step 4. Removal of first mold and magnet*

Si/Invar Laminate

Magnetic Mold

Permanent magnets

Hard magnet thickness: 6.35mm
Iron thickness: 0.1mm

Hard Magnet Radius (m)

Pull Force (N)

*Hard magnet radius: 22.2mm*
*Hard magnet thickness: 6.35mm*

Iron Thickness (m)

Pull Force (N)

Bonded Sample: Si side

37 mm

Bonded Sample: Invar side

37 mm

Curved Invar

Mold

Electromagnet
(engaged)

Electromagnetic Curving

Invar (curved)

Top side

Invar:
37 mm X 37
mm X 100 um

Magnet
underneath

Ferritic stainless steel,
convex, transfer mold
(186 mm ROC)

Back side

Magnet

MAGNETIC CURVING OF IMAGING SENSORS

CROSS-REFERENCE TO RELATED APPLICATION(S)

The present application claims priority to and the benefit of U.S. Provisional Application No. 63/237,094, filed Aug. 25, 2021, entitled "MAGNETIC CURVING OF IMAGING SENSORS", the entire content of which is incorporated herein by reference.

GOVERNMENT LICENSE RIGHTS

This invention was made with U.S. Government support under contract No. N66001-20-C-4011 awarded by the Defense Advanced Research Projects Agency (DARPA). The U.S. Government has certain rights in this invention.

FIELD

One or more aspects of embodiments according to the present disclosure relate to optical detectors, and more particularly to curved optical detectors.

BACKGROUND

Spherical aberrations may be introduced when an optical system projects an image onto a flat surface, such as the surface of a flat image sensor chip. Such spherical aberrations may be reduced by suitable design of the optical system, but the complexity of the optical system may increase as a result. The use of a curved optical array detector may reduce spherical aberrations without increasing the complexity of the optical system.

Thus, there is a need for a system and method for magnetic curving of imaging sensors.

SUMMARY

According to an embodiment of the present disclosure, there is provided an article, including: an optical array detector; and a magnetic substrate coupled to the optical array detector, the optical array detector having a light-sensitive surface, the light-sensitive surface having a curvature of at least 1/m.

In some embodiments, the optical array detector is a semiconductor chip.

In some embodiments, the optical array detector has a thickness greater than 10 microns and less than 400 microns.

In some embodiments, the light-sensitive surface has a Gaussian curvature of at least $1/m^2$.

In some embodiments, the optical array detector is bonded to the magnetic substrate.

In some embodiments, the article further includes a mold having a curved surface, wherein the optical array detector and the magnetic substrate are conformed to the curved surface of the mold.

In some embodiments,: the optical array detector has a second surface, opposite the light-sensitive surface, and the magnetic substrate is on the second surface of the optical array detector.

In some embodiments, the article further includes a non-magnetic solid substrate, wherein the magnetic substrate is between the second surface of the optical array detector and a surface of the non-magnetic solid substrate.

In some embodiments, the article further includes a magnet, the magnet being configured to apply a force to the magnetic substrate, the force causing the optical array detector to have the curvature.

According to an embodiment of the present disclosure, there is provided a method for constructing a detector assembly, the method including: applying a magnetic force to a magnetic substrate; and applying, by the magnetic substrate, in response to the magnetic force, a bending force to an optical array detector, the bending force causing a light-sensitive surface of the optical array detector to have a curvature of at least 1/m.

In some embodiments, the optical array detector is a semiconductor chip.

In some embodiments, the optical array detector has a thickness greater than 10 microns and less than 400 microns.

In some embodiments, the bending force further causes the light-sensitive surface to have a Gaussian curvature of at least $1/m^2$.

In some embodiments, the optical array detector is bonded to the magnetic substrate.

In some embodiments: the optical array detector has a second surface, opposite the light-sensitive surface, and the magnetic substrate is on the second surface of the optical array detector.

In some embodiments, the optical array detector is coupled to a non-magnetic solid substrate, and the non-magnetic solid substrate is coupled to the magnetic substrate.

In some embodiments, the applying of the magnetic force and the applying of the bending force includes causing the magnetic substrate and the optical array detector to conform to a curved surface of a first mold.

In some embodiments, the method further includes transferring the optical array detector from the curved surface of the first mold to a curved surface of a second mold.

In some embodiments, the applying of the magnetic force includes applying the magnetic force with a permanent magnet.

In some embodiments, the applying of the magnetic force includes applying the magnetic force with an electromagnet.

BRIEF DESCRIPTION OF THE DRAWINGS

These and other features and advantages of the present disclosure will be appreciated and understood with reference to the specification, claims, and appended drawings wherein:

FIG. 1G is a schematic side view of a magnet array, according to an embodiment of the present disclosure;

FIG. 1H is a schematic side view of a magnet array, according to an embodiment of the present disclosure;

FIG. 1I is a schematic side view of a magnet array, according to an embodiment of the present disclosure;

FIG. 1J is a schematic side view of a magnet array, according to an embodiment of the present disclosure;

FIG. 6I is a graph of simulation results, according to an embodiment of the present disclosure;

DETAILED DESCRIPTION

The detailed description set forth below in connection with the appended drawings is intended as a description of exemplary embodiments of a system and method for magnetic curving of imaging sensors provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
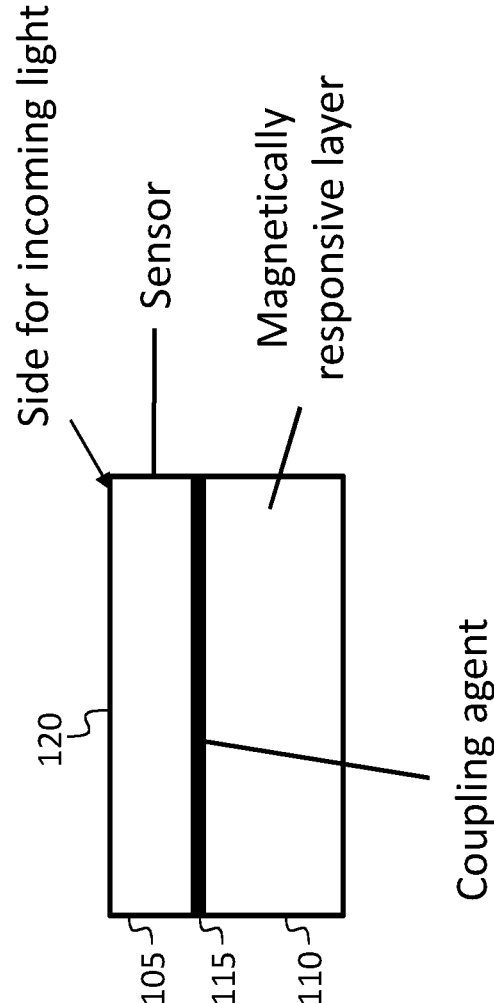
FIG. 1A is a schematic side view of a portion of a detector assembly, according to an embodiment of the present disclosure.

In some embodiments, an optical array detector, e.g., an image sensor chip is fabricated as a substantially flat semiconductor chip, and a magnetic force is then employed to deform it into a curved shape. As used herein, an "optical" array detector is an array detector capable of detecting light at one or more wavelengths in the range from 100 nm to 1 mm. Referring to FIG. 1A, the image sensor chip 105 may be bonded to a magnetically responsive layer (or "magnetically responsive substrate" or simply "magnetic substrate") 110 by a coupling agent 115 (which may be a permanent coupling agent or a temporary coupling agent). A magnetic field may then be applied to the magnetically responsive substrate 110 to bend the image sensor chip 105 and the magnetically responsive substrate 110 into a curved shape (e.g., by pulling the image sensor chip 105 and the magnetically responsive substrate 110 against, so that they conform to the curved surface of a mold), as discussed in further detail below. The image sensor chip 105 may have a first surface 120 (the top surface as illustrated in FIG. 1A) which may be a light-sensitive surface, and a second surface, opposite to the first surface, which may (as shown) be in contact with the coupling agent 115. The curved image sensor chip 105 may (together with, e.g., (i) the magnetically responsive substrate 110, (ii) a mold that defines the shape of the curved image sensor chip 105, (iii) one or more optical elements (e.g., lenses), and (iv) read-out electronics), be part of a detector assembly. When curved, the image sensor chip 105 (e.g., the light-sensitive surface 120 of the image sensor chip 105) and the magnetically responsive substrate 110 may have a curvature of at least 1/m, or a Gaussian curvature of at least $1/m^2$. In some embodiments, the image sensor chip 105 and the magnetically responsive substrate 110, when curved, have a curvature of at least 1/m, and a Gaussian curvature of less than $1/m^2$ (e.g., a Gaussian curvature of zero). In some embodiments the first surface of the image sensor chip 105, when curved, has the shape of a portion of the surface of a sphere having a radius curvature between 1.5 times and 10 times the diagonal across the image sensor chip The image sensor chip 105 may be configured to convert light energy into electrical signals. It may be sensitive to visible or infrared (IR) light, including near IR (NIR), short-wavelength IR (SWIR), medium-wavelength IR (MWIR) and long-wavelength IR (LWIR). IR sensing image sensor chips may include Type II strained-layer superlattice (SLS) (e.g., InAs/GaSb, InAs/GaInSb, InAs/InAsSb), III-V bulk alloy, photovoltaic material (e.g., mercury cadmium telluride, InSb, PbSnTe, PtSi), photoconductive material (e.g. mercury cadmium telluride, InSb, InGaAs/InP, Ge, doped silicon), quantum well IR photodetectors (QWIP) (e.g. GaAs/AlGaAs) or a microbolometer (e.g., vanadium oxide or amorphous silicon). Visible light sensing image sensor chips may include charge-coupled device (CCD) chips and complementary metal-oxide-semiconductor (CMOS) chips. In the image sensor chip 105, a plurality of light sensing elements may be arranged into an array. The light sensing elements may be spaced between 0.5 μm (microns) and 40 μm apart, and they may be coupled to a semiconductor substrate (which may be silicon, germanium, or another semiconductor material). The semiconductor substrate may include semiconductor devices (e.g., transistors) that may be part of a read out integrated circuit (ROIC), which may also include oxide layers and metal lines (e.g., metal wires). The light sensor chip may have one surface (the light-sensitive surface 120) that is transparent to, or sensitive to, the electromagnetic spectrum of interest (e.g., visible, NIR, SWIR, MWIR, LWIR).

The magnetically responsive substrate 110 may be made from a magnetically responsive material (e.g., a ferromagnetic material), e.g., it may be a soft magnet. The magnet 210 (e.g., FIG. 2A) may have a high relative permeability, a high magnetic saturation point, and a low coercivity. Further, the magnetically responsive material may have an elongation to failure of at least 1%. Materials of which the magnetically responsive substrate 110 may be composed include Fe, Ni, Co and their alloys, such as Ni—Fe (e.g. invar), Fe—Si, steel, and ferritic and martensitic stainless steels.

Figure 1C:
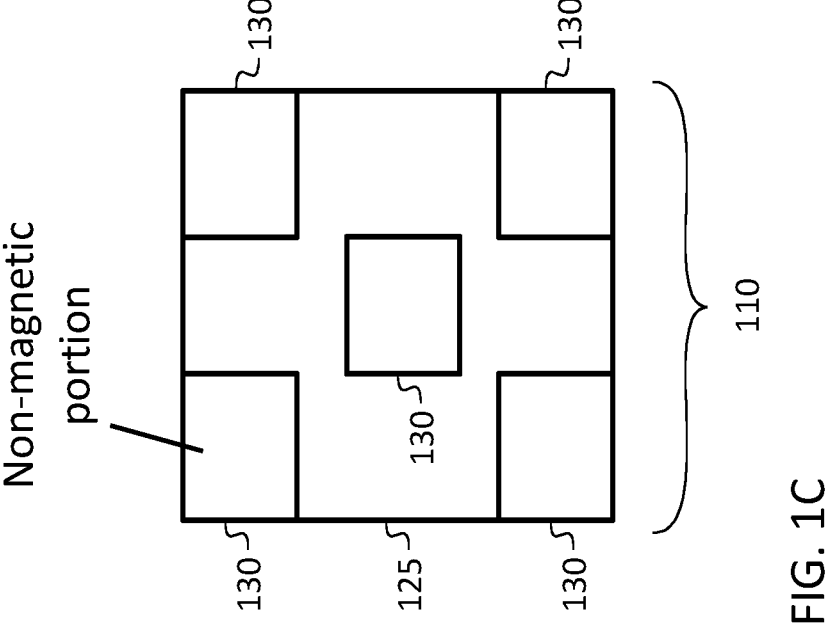
FIG. 1C is a schematic bottom view of a portion of a detector assembly, according to an embodiment of the present disclosure.
Figure 1B:
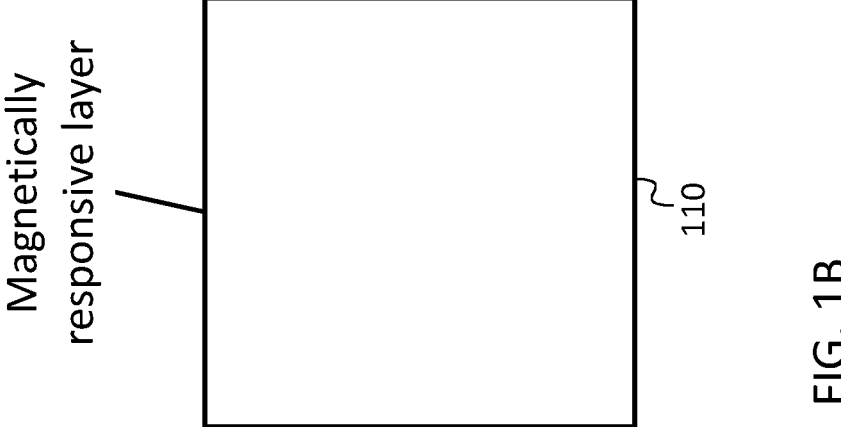
FIG. 1B is a schematic bottom view of a portion of a detector assembly, according to an embodiment of the present disclosure.
Figure 1E:
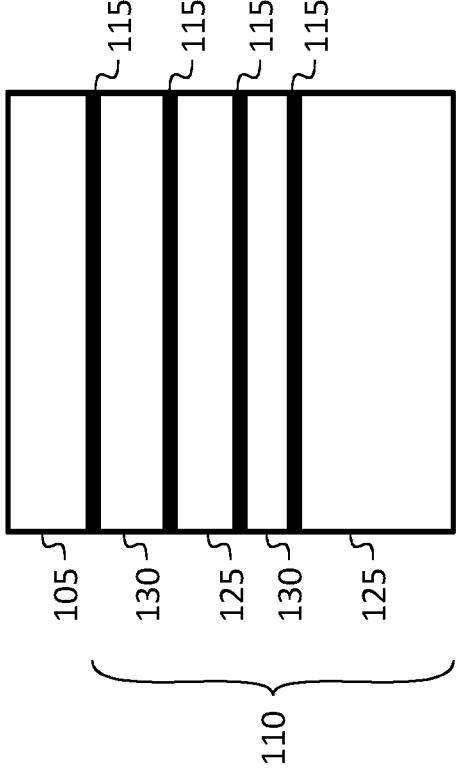
FIG. 1E is a schematic side view of a portion of a detector assembly, according to an embodiment of the present disclosure.
Figure 1D:
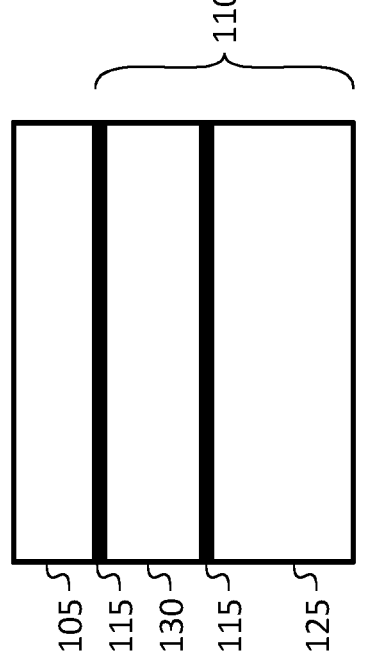
FIG. 1D is a schematic side view of a portion of a detector assembly, according to an embodiment of the present disclosure.

The magnetically responsive substrate 110 may be uniform (as illustrated in FIG. 1B) or it may include (as illustrated in FIG. 1C) one or more magnetic portions 125 and one or more non-magnetic portions (e.g., non-magnetic layers) 130. Each of the non-magnetic portions may be of a different material. The magnetic portions 125 and the non-magnetic portions 130 may be stacked adjacent to, or through one-another (as shown in FIG. 1C). Alternatively, the non-magnetic portions 130 may be layers distributed between layers of magnetic portions 125, as shown in FIGS. 1D and 1E. Each of the non-magnetic portions 130 may be 1 μm to 1000 μm thick, e.g., between 50 μm and 400 μm. The in-plane size of the magnetically responsive substrate 110 may encompass an area smaller or larger than the area of the image sensor chip 105. In some embodiments, the in-plane size encompassed is between 75% and 150% of the area of the image sensor chip 105. In some embodiments, the in-plane size of the magnetically responsive substrate 110 matches the area of the image sensor chip 105. The magnetic portions 125 and the non-magnetic portions 130 may be made with designed patterns (e.g., repeating mesh patterns), e.g., rectangles (as shown in FIG. 1C), triangles, hexagons, or radiated-leaf patterns. This may improve bending flexibility and prevent wrinkling in the bending process.

Figure 1F:
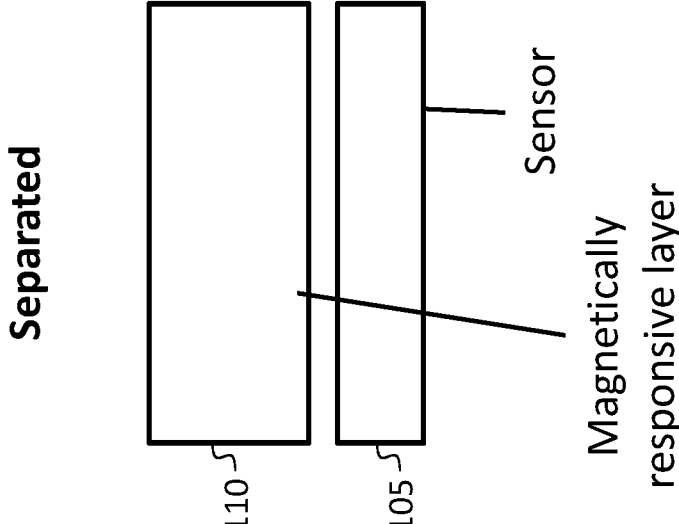
FIG. 1F is a schematic side view of a portion of a detector assembly, according to an embodiment of the present disclosure.

In one embodiment, the magnetically responsive layer 110 is integral with the image sensor chip. In an alternate embodiment, the magnetically responsive layer 110 is temporarily bonded to the image sensor chip, and subsequently separated from the image sensor chip 105, as illustrated in FIG. 1F. In another alternate embodiment, the magnetically responsive layer is separate from the image sensor chip.

The detector assembly may also include a transparent solid substrate, e.g., a solid substrate that is transparent to the electromagnetic spectrum of interest (e.g. visible, IR). The transparent solid substrate may be epitaxially matched to the image sensor chip 105. Examples of suitable materials may include Si, GaAs or GaSb. The transparent solid substrate may correct for coefficient of thermal expansion (CTE) mismatch. Such a transparent solid substrate may be coupled to the light-sensitive surface of the image sensor chip 105. The transparent solid substrate may be between 10 μm and 1000 μm thick, and it may match the thickness of the image sensor chip 105. The thickness of the image sensor chip 105 may be between 10 microns and 400 microns. The in-plane size of the transparent solid substrate may encompass an area smaller than, or larger than, or equal to, the image sensor chip area. The in-plane size encompassed may be between 40% and 200% of the area of the image sensor chip 105. As used herein, "coupled" means attached. For example if a first layer is coupled to a second layer, the first layer may be bonded to the second layer (e.g., by a permanent coupling agent or a temporary coupling agent), or the first layer may be formed on (e.g., deposited on) the second layer.

The detector assembly may also include a non-magnetic solid substrate, which may be selected to (i) mechanically stabilize the image sensor through the curving process, to (ii) correct for CTE mismatch of the various layers through the detector surface, and to (iii) present a desirable surface for subsequent device integration. The correcting for CTE mismatch may be done by achieving a desired effective CTE, or a balance of CTE's through the thickness of the article. The presenting of a desirable surface for subsequent device integration may promote thermal conductivity between the article (the combination of the image sensor chip 105 and the magnetically responsive substrate 110) and the integration surface, promote or prevent a chemical reaction with the integration surface, or electrically insulate the article from the integration surface.

The material of the non-magnetic solid substrate may be selected for various properties including coefficient of thermal expansion, Young's modulus, Poisson's ratio, toughness, chemical stability, ability to act as a diffusion barrier or enhancer, electrical insulation, thermal conductivity, and an elongation to failure of at least 1%. Suitable materials may include: Mo, W, Cr, Nb, Ta, V, Ti, Zr, Hr, Fe, Cu, Ag, Au, Zn, Cd, Al, In, Pb, and their alloys and composites. Examples of such alloys include iron-nickel alloys (e.g., Kovar, Alloy 49, F15), Cu—Mo, Cu—W, and austenitic stainless steels. Examples of composites include aluminum silicon carbide (AlSiC).

The non-magnetic solid substrate may be composed of a single material, or it may include portions of different materials. The portions may be stacked adjacent, e.g., through one-another. Alternatively, portions of one material may be layers distributed between portions of one or more other materials. As used herein, the "non-magnetic solid substrate" is a substrate that need not include (although it may include) magnetic materials. For example, in some embodiments, the materials include one or more magnetic materials and one or more non-magnetic materials. Each solid substrate may be between 1 μm and 1000 μm thick, e.g., between 50 μm and 400 μm thick. The in-plane size of the non-magnetic solid substrate may encompass an area smaller or larger than the area of the image sensor chip 105. In some embodiments, the in-plane size encompassed is between 75% and 150%, e.g., 100%, of the image sensor chip area.

The detector assembly may also include one or more couplings (e.g., bonding layers) between the image sensor chip and one or more substrates. The image sensor chip 105 may be coupled to at least one magnetic substrate. Coupling of multiple substrates to one image sensor may be separated in-plane, or stacked out-of-plane. One or more non-magnetic substrates may be coupled (e.g. bonded) (i) between the non-transparent face of the image sensor chip and a magnetic substrate (ii) between magnetic substrates, (iii) between non-magnetic substrates, or (iv) to a non-magnetic or magnetic substrate. Coupling, to the image sensor chip 105, of any non-transparent substrate may be to the second surface (opposite the light-sensitive surface 120), or to the light-sensitive surface 120 if the bond is temporary, and only attached during the forming process, and then removed before using the sensor. Coupling, to the image sensor chip 105 of any transparent substrate, may be to either the light-sensitive surface 120 or the second surface.

Coupling methods may include bonding, adhering, depositing or attaching. For example, such methods may include (i) adhering the substrate to the image sensor chip, (ii) using a thermosetting polymer (e.g. epoxy) or pressure sensitive adhesive, (iii) bonding through a fuse or welding operation, (iv) deposition by electroplating, electroless plating, plasma spray, chemical vapor deposition (CVD), electron-beam CVD, or sputter coating, or (v) spin-coating of a polymer followed by UV or thermal cure. The coupling may occur either when image sensor chips are still at the wafer level or after singulation of individual chips. An interfacial layer (e.g., a primer layer or a seed layer) may be coupled to a substrate before coupling to the image sensor chip 105, to promote coupling. A protective layer may be added to the transparent surface of the image sensor or the non-coupled surface of the substrate to prevent damage during the coupling procedure. Protective layers may include self-adhesive tapes or deposited layers removable by chemical etching.

Figures 4A, 4B, 4C, 4D:
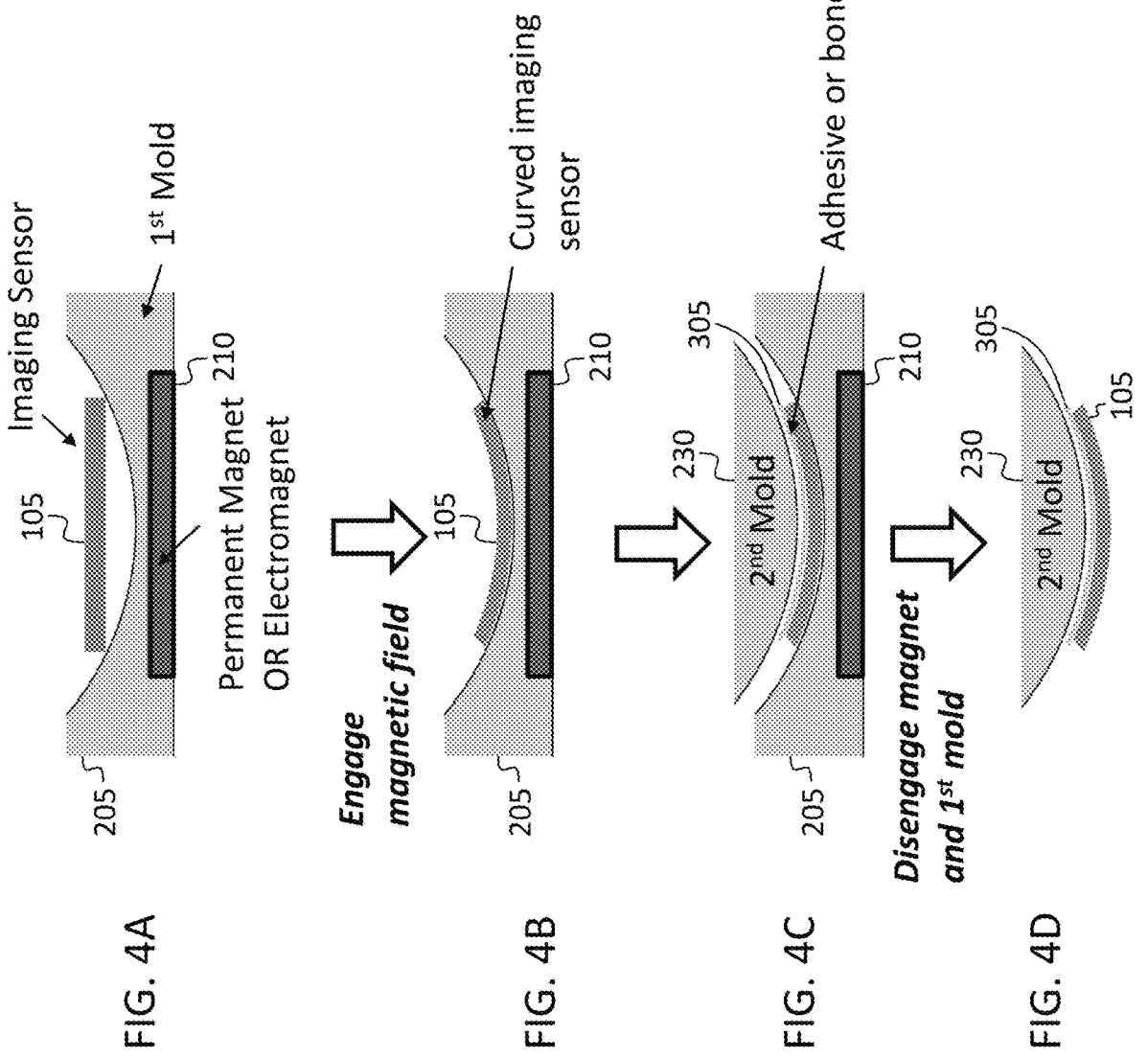
FIG. 4A is a schematic side view of an intermediate configuration in the fabrication of a detector assembly, according to an embodiment of the present disclosure.
FIG. 4B is a schematic side view of an intermediate configuration in the fabrication of a detector assembly, according to an embodiment of the present disclosure.
FIG. 4C is a schematic side view of an intermediate configuration in the fabrication of a detector assembly, according to an embodiment of the present disclosure.
FIG. 4D is a schematic side view of a final configuration in the fabrication of a detector assembly, according to an embodiment of the present disclosure.
Figures 5A, 5B:
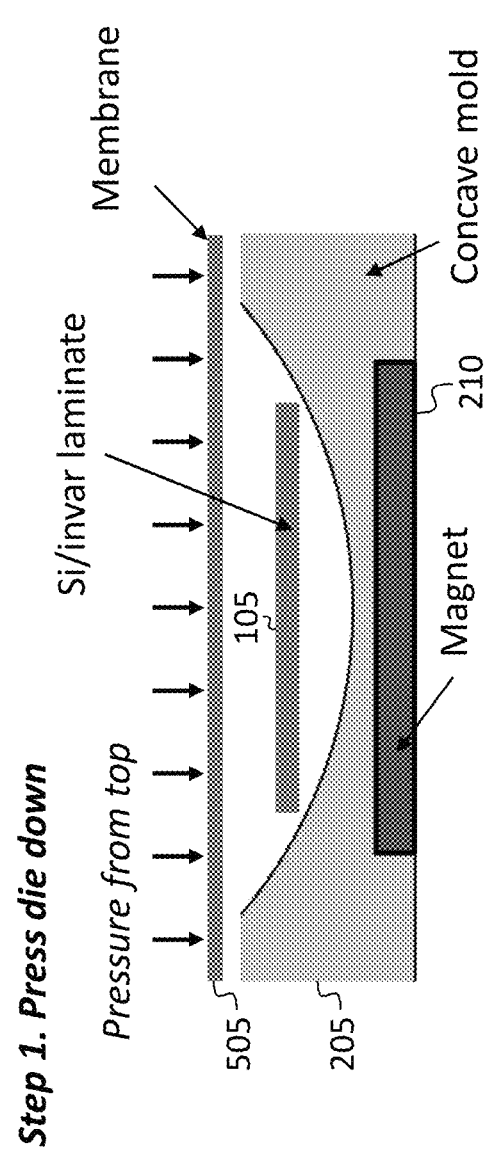
FIG. 5A is a schematic side view of an intermediate configuration in the fabrication of a detector assembly, according to an embodiment of the present disclosure.
FIG. 5B is a schematic side view of an intermediate configuration in the fabrication of a detector assembly, according to an embodiment of the present disclosure.
Figure 5C:
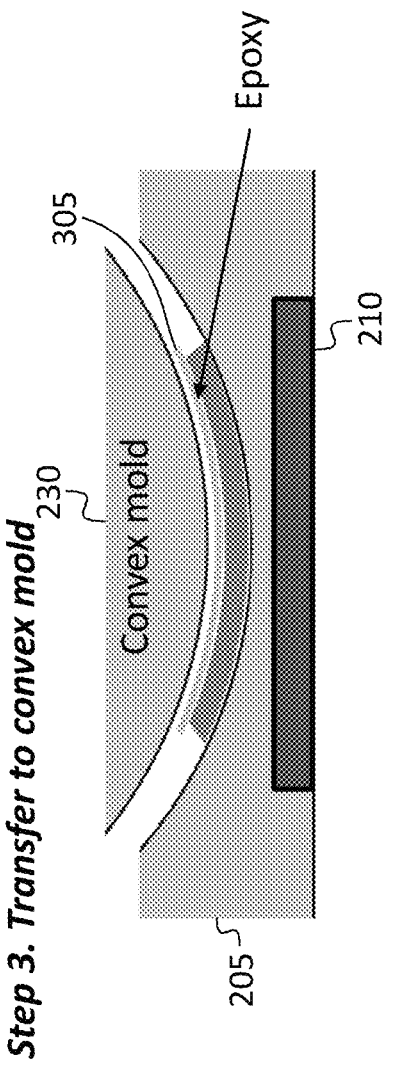
FIG. 5C is a schematic side view of an intermediate configuration in the fabrication of a detector assembly, according to an embodiment of the present disclosure.
Figure 5D:
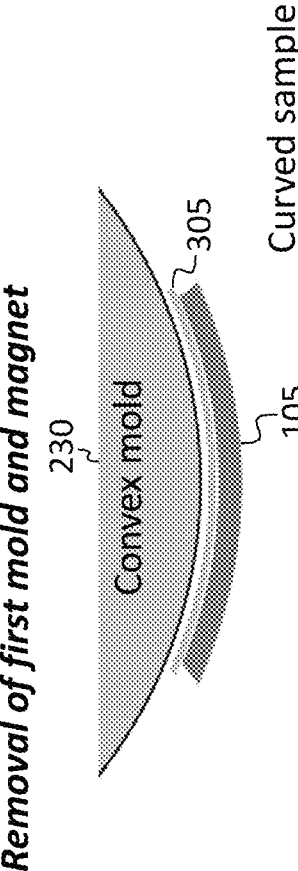
FIG. 5D is a schematic side view of a final configuration in the fabrication of a detector assembly, according to an embodiment of the present disclosure.

In some embodiments, the detector assembly may be fabricated using one or more of the methods described below. Materials that may be used in such methods may include a source generating a magnetic field, an image sensor chip 105, a magnetically responsive layer, a first mold 205 (shown, e.g., in FIG. 2A, and discussed in further detail below) with a curved molding surface, a second mold 230 (shown, e.g., in FIG. 4C, and discussed in further detail below) with a curved molding surface, and a coupling agent.

The source generating the magnetic field may include a permanent magnet 210 (e.g., a hard magnet). The material or materials of which the permanent magnet 210 is or are composed may include, but are not limited to, Alnicos (i.e., Fe, Co, Ni alloys with small amounts of Al, Cu and Ti), hard ferrites (e.g., BaO6Fe2O3, SrO6Fe2O3), samarium cobalt materials (e.g., SmCo5, Sm2Co17), and neodymium iron boride (NbFeB) materials.

Figures 1G, 1H, 1I, 1J:
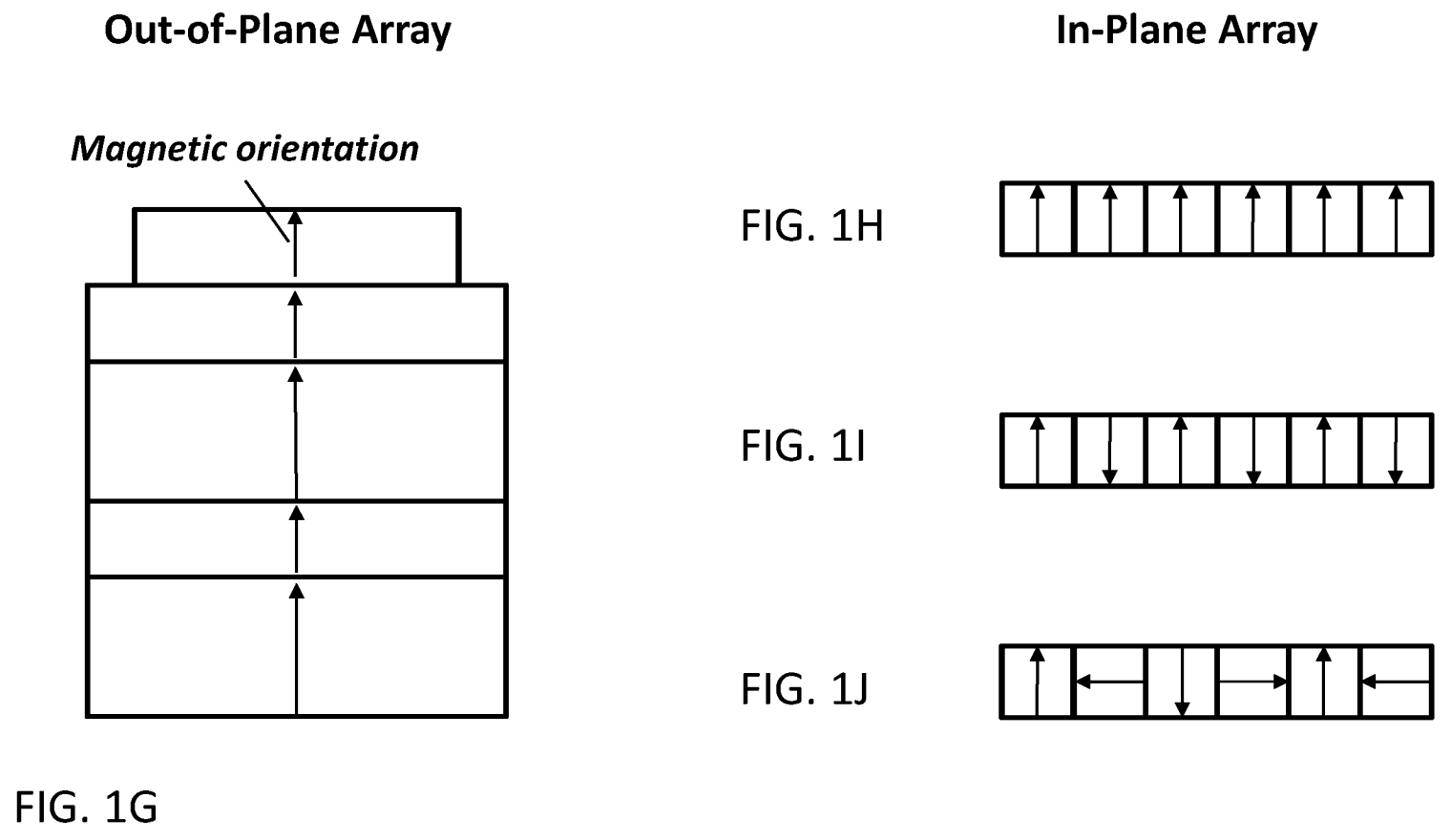

A single magnet 210 or multiple magnets may be used. Multiple magnets may be stacked out of plane with the same orientation to increase the magnetic field, as shown in FIG. 1G. An array of magnets may be arranged in-plane with changes to their orientation to control the magnetic field. For example, they may be oriented (i) such that all their poles align (as illustrated in FIG. 1H) (ii) in a grid of alternating (north/south) polarity (as illustrated in FIG. 1I) (iii) in a progressive rotation, forming a Halbach array (as illustrated in FIG. 1J), or (iv) in another configuration of varying magnetic polarity across the array. The magnet array may be arranged to match the curvature of the mold to provide a uniform attractive force on the magnetic substrate. Non-magnetic materials may be included to, e.g., (i) align, orient, or space the magnetic elements, (ii) affix the magnetic elements, (iii) provide a coupling surface, or (iv) protect the magnetic elements. Such a non-magnetic material may be, e.g., a soft magnet, or a polymer (e.g., a thermoplastic, thermoset, or elastomer).

The source generating the magnetic field may have one flat face, which may be suitable for placing the source generating the magnetic field on a flat support surface, e.g., a table. One face may be curved with a radius of curvature between infinity (i.e., the surface may be flat) and 20% smaller than the radius of curvature of the molding surface. The in-plane size of the permanent magnet 210 may encompass an area smaller or larger than the area of the image sensor chip 105. In some embodiments, the in-plane size encompassed is between 40% and 100% (e.g., 90%) of the image sensor chip area. The source generating the magnetic field may include an electromagnet or an array of electromagnets. The in-plane size of the electromagnet may encompass an area smaller or larger than the image sensor chip area. In some embodiments, the in-plane size encompassed is between 40% and 100% (e.g., 90%) of the image sensor chip area. The electromagnet may be fabricated from a coil of wire. A soft magnetic rod may be placed in the center of the coil to increase the magnetic pull. An array of electromagnets may be designed to enable local force control or magnetic switching. Local force control may enable the sequent engagement of the magnetically responsive substrate 110, which may improve the stress or displacement uniformity during the engagement. Local force control may also facilitate the adhesion or bonding process by eliminating trapped bubbles.

The image sensor chip 105 may be configured to convert light energy into electrical signals. It may be sensitive to visible or infrared (IR) light, including near IR (NIR), short-wavelength IR (SWIR), medium-wavelength IR (MWIR) and long-wavelength IR (LWIR). IR sensing image sensor chips may include Type II strained-layer superlattice (SLS) (e.g., InSb, InAs/InAsSb), III-V bulk alloy, photovoltaic material (e.g., mercury cadmium telluride, InSb, PbSnTe, PtSi), photoconductive material (e.g. mercury cadmium telluride, InSb, InGaAs/InP, Ge, doped silicon) and a microbolometer (e.g., vanadium oxide or amorphous silicon). Visible light sensing image sensor chips include charge-coupled device (CCD) and complementary metal-oxide-semiconductor (CMOS). In the image sensor chip, a plurality of light sensing elements may be arranged into an array. The light sensing elements may be spaced between 0.5 μm (microns) and 40 μm apart, and they may be coupled to a semiconductor substrate (which may be silicon, germanium, or another semiconductor material). The semiconductor substrate may include semiconductor devices (e.g., transistors) that may be part of a read-out integrated circuit (ROIC), which may also include oxide layers and metal lines (e.g., metal wires). The light sensor chip may have one surface (the light-sensitive surface) that is transparent to, or sensitive to, the electromagnetic spectrum of interest (e.g., visible, NIR, SWIR, MWIR, LWIR).

The magnetically responsive substrate 110 may be made from a magnetically responsive material (e.g., a ferromagnetic material), e.g., it may be a soft magnet. The layer may include between 20 vol. % and 100 vol. % (e.g., between 50 vol. % and 100 vol. %) of soft magnetic materials. The magnet 210 may have a high relative permeability, a high magnetic saturation point, and a low coercivity. Further, the magnetically responsive material may have an elongation to failure of at least 1%. Materials of which the magnetically responsive substrate 110 may be composed include, but are not limited to, Fe, Ni, Co and their alloys, such as Ni—Fe (e.g. invar), Fe—Si, steel, and ferritic and martensitic stainless steels. Other materials of which the magnetically responsive substrate 110 may be composed include, but are not limited to, metals, metal alloys, polymers (thermosets, thermoplastic, elastomers), polymer matrix composites, and metal matrix composites.

In one embodiment, the magnetically responsive layer is an architected material or structure. Control over the magnetic permeability of the magnetically responsive layer may be advantageous for the providing of a proper amount of pull strength for magnetic curving to different curvatures. This control may pair with the mechanical stiffness of the material, e.g., the magnetic permeability may be selected in light of the mechanical stiffness, or vice versa. Small or tight curvatures may be formed using lower stiffness and higher permeability. An architected material may be made utilizing additive manufacturing techniques; using such techniques, the magnetically responsive layer may be designed and fabricated to optimize both the mechanical stiffness and magnetic permeability of the magnetically responsive layer. An architected structure may (i) reduce the amount of strain energy stored in the deformed magnetically responsive layer or (ii) ease the bending process. For example, the layer may be modified with slits or patterned material removal.

The first mold 205 may include a curved molding surface. The molding surface may have the desired surface profile for the image sensor chip to adopt once curved, e.g., it may be within 10% of the desired surface profile. The surface profile may be spherical, elliptical, parabolic, U-shaped, or a non-prismatic shape (e.g., an arbitrary other shape). The opposite surface, or "back surface" of the first mold 205 may be flat or may contain features to mate with the source generating the magnetic field. The first mold 205 may be made from a metal (e.g., Mo, W, Nb, Ti, Fe, Cu, Al, and their alloys and composites). Examples of alloys of interest include iron-nickel alloys (e.g., Invar, Kovar, Alloy 49, F15), Cu—Mo, Cu—W, steels, and stainless steels. Examples of composites include aluminum silicon carbide (AlSiC). Alternatively, the mold may be made from a plastic (thermoplastic, thermoset, elastomer) or plastic reinforced composite. Alternatively, the mold may be made from a ceramic (e.g., Al2O3, SiC, SiOC, Si3N4, or glass).

The molding surface may be polished or roughened. The molding surface may have a chemical treatment to promote or prevent adhesion. The back surface of the first mold 205 may be integrated with magnetic materials (such as MUMETAL™, METGLAS™ OR PERMALLOY™) with high magnetic permeability to enhance the attractive force from either permanent magnets or electromagnets. The higher attractive force may enable the bending of a laminate with greater thickness.

The second mold 230 (if used) may also include a curved molding surface. The molding surface may be a mating surface to the molding surface of the first mold 205. The opposite surface of the second mold 230 may be flat or may contain features to mate with the source generating the magnetic field. The second mold 230 may be made from a metal (e.g., Mo, W, Nb, Ti, Fe, Cu, Al, and their alloys and composites). Examples of alloys of interest include iron-nickel alloys (e.g., Invar, Kovar, Alloy 49, F15), Cu—Mo, Cu—W, steels, and stainless steels. Examples of composites include aluminum silicon carbide (AlSiC). Alternatively, the mold may be made from a plastic (thermoplastic, thermoset, elastomer) or plastic reinforced composite. Alternatively, the second mold 230 may be made from a ceramic (e.g., Al2O3, SiC, SiOC, Si3N4, or glass). The molding surface may be polished or roughened. The molding surface may have a chemical treatment to promote or prevent adhesion.

The coupling agent may be used with, or part of, coupling methods including bonding, adhering, attaching. Candidate methods include (i) adhering the substrate to the image sensor chip 105, using a thermosetting polymer (e.g., epoxy, polyurethane, polyuria, vinyl ester, cyanoacrylate), a UV curable (acrylate) or a pressure sensitive adhesive, or (ii) bonding through a fusing or welding operation.

A procedure for fabricating the detector assembly may include various steps, as described below. Three embodiments, referred to as a first embodiment, a second embodiment, and a third embodiment, may be used.

Figures 2A, 2B, 2C:
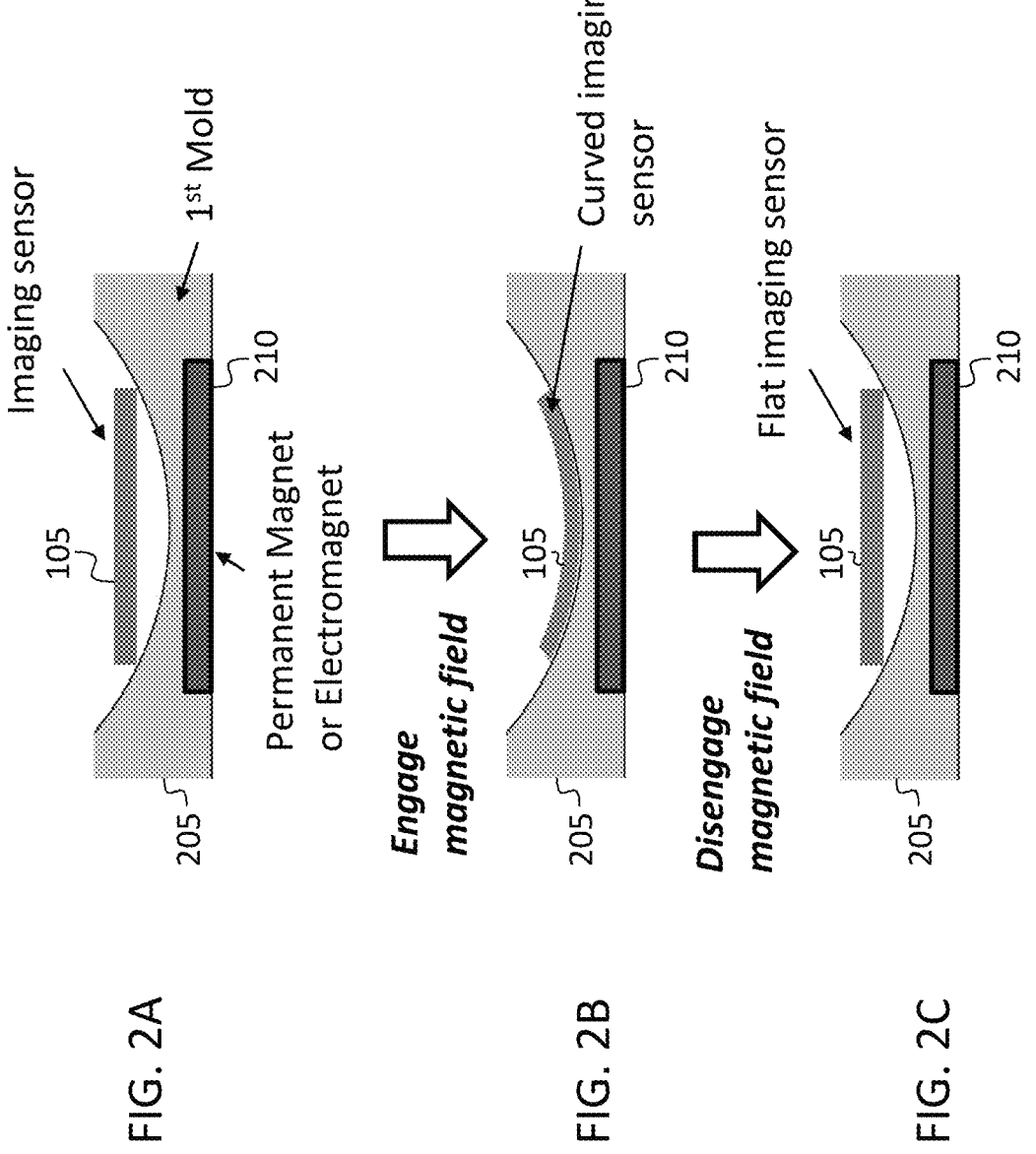
FIG. 2A is a schematic side view of an intermediate configuration in the fabrication of a detector assembly, according to an embodiment of the present disclosure.
FIG. 2B is a schematic side view of an operating configuration in the fabrication of a detector assembly, according to an embodiment of the present disclosure.
FIG. 2C is a schematic side view of a post-operating configuration in the fabrication of a detector assembly, according to an embodiment of the present disclosure.
Figures 3A, 3B, 3C, 3D:
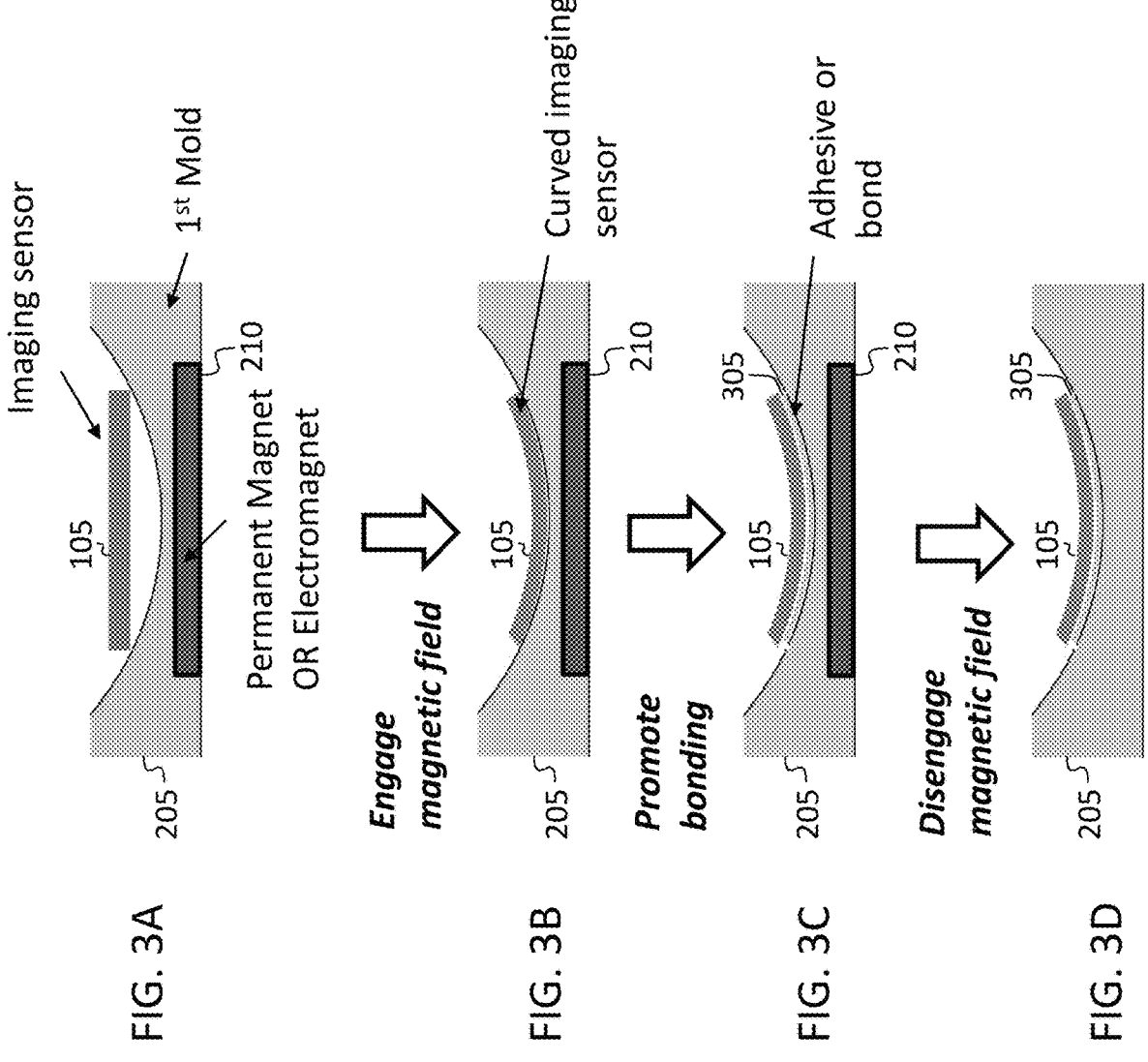
FIG. 3A is a schematic side view of an intermediate configuration in the fabrication of a detector assembly, according to an embodiment of the present disclosure.
FIG. 3B is a schematic side view of an intermediate configuration in the fabrication of a detector assembly, according to an embodiment of the present disclosure.
FIG. 3C is a schematic side view of an intermediate configuration in the fabrication of a detector assembly, according to an embodiment of the present disclosure.
FIG. 3D is a schematic side view of a final configuration in the fabrication of a detector assembly, according to an embodiment of the present disclosure.

In the first embodiment, illustrated in FIGS. 2A-2C, the imaging sensor is curved into a first mold 205 without coupling. The image sensor chip 105 and magnetically responsive substrate 110, which may be coupled to the second surface of the image sensor chip 105, may (FIG. 2A) be brought into proximity with the curved surface of the first mold 205 (with the light-sensitive surface 120 of the image sensor chip 105 facing away from the curved surface of the first mold 205), the curved surface of which may be treated with a chemical release agent or lubricant. A polymer film or weave may be placed between the sensor and curved molding surface to act as a non-stick surface or a contact barrier. In some embodiments, a separate magnetically responsive layer, distinct from the imaging sensor, is brought into proximity with the curved surface, sandwiching the imaging sensor between the curved surface and the separate magnetically responsive layer. This separate magnetically responsive layer may subsequently be removed before image acquisition by the image sensor chip 105 begins. In embodiments in which such a separate magnetically responsive layer is used, the magnetically responsive substrate 110 coupled to the second surface of the image sensor chip 105 may or may not be present.

The magnetic field may then be engaged (FIG. 2B). This may be accomplished by (i) progressively increasing the voltage (or current) supplied to an electromagnet located at the back surface (the opposite surface to the curved surface) of the first mold 205, or (ii) abruptly increasing the voltage. Alternatively, the electromagnet may be engaged first, followed by the magnetically responsive layer (whether within the imaging sensor or separate) being brought into closer proximity to the curved surface. Alternatively, a permanent magnet 210 may be brought into close proximity with the back surface of the first mold 205. Alternatively, the permanent magnet may be situated at the back surface of the first mold 205 and the magnetically responsive layer (whether within the imaging sensor or separate) may be brought into closer proximity to the curved surface. The magnetic field may be left engaged for the duration of the detector assembly's use, and the magnet 210 may later be disengaged (FIG. 2C) to allow the sensor to return to its pre-curved shape. Disengagement of the field may be progressive or abrupt.

In the second embodiment, illustrated in FIGS. 3A-3D, the imaging sensor is coupled to the first mold 205 after curving into the first mold 205. The method of the second embodiment may include the following steps. The curved molding surface or the imaging sensor may be pretreated and prepared for adhesion or bonding. For adhesion, methods of pre-treatment to promote adhesion include, for example, oxygen plasma, chemical modification (e.g., silanization, or deposition of acrylate monomers), mechanical roughening, or etching. The adhesion may then be accomplished by (i) applying a thermosetting polymer (e.g. epoxy), UV curable polymer (e.g., acrylate) or pressure sensitive adhesive to one or both surfaces, or (ii) applying a film adhesive to one or both surfaces. Additionally, a scrim or weave may be added to one or both of the surfaces. For solder bonding, methods to promote bonding include, for example, mechanical roughening, etching, flux coating, or metal seed layer plating (e.g., Au). Solder or a low melting point metal or metallic alloy (e.g., a metal or alloy having a melting point below 250C (250 degrees Celsius), e.g., below 200C) may be applied to one or both surfaces.

The image sensor chip 105 and the magnetically responsive substrate 110, which may be coupled to the second surface of the image sensor chip 105 may then (FIG. 3A) be brought into proximity with the curved surface of the first mold 205. In some embodiments, a magnetically responsive layer, distinct and separate from the imaging sensor, may be brought into proximity with the curved surface, sandwiching the imaging sensor between the curved surface and the magnetically responsive layer. This separate magnetically responsive layer may subsequently be removed before image acquisition by the image sensor chip 105 begins; in embodiments in which such a separate magnetically responsive layer is used, the magnetically responsive substrate 110 coupled to the second surface of the image sensor chip 105 may or may not be present.

The magnetic field may then (FIG. 3B) be engaged. This may be accomplished by (i) progressively increasing the voltage supplied to an electromagnet located at the back surface of the first mold 205, or by (ii) increasing the voltage abruptly, or by (iii) engaging the electromagnet first, followed by the magnetically responsive layer (whether within the imaging sensor or separate) being brought into closer proximity with the curved surface. In some embodiments the field may be engaged by (i) bringing a permanent magnet into close proximity with the back surface of the first mold 205 or (ii) situating the permanent magnet at the back surface of the first mold 205 and bringing the magnetically responsive layer (whether within the imaging sensor or separate) into closer proximity with the curved surface. The method of the second embodiment may further include (FIG. 3C) (i) promoting, in a bonding layer 305, adhesion and bonding of the imaging sensor to the curved mold surface, e.g., through heat, UV light, pressure or a combination thereof, (ii) disengaging (FIG. 3D) the magnet 210 (progressively or abruptly) to reveal a curved sensor bonded or adhered to a curved mold, (iii) a second adhesion and bonding promotion step, which may use heat, UV light, pressure or a combination thereof, and (iv) releasing the separate magnetically responsive layer from the imaging sensor, if a separate magnetically responsive layer was used.

In the third embodiment, illustrated in FIGS. 4A-4D, the imaging sensor is transferred and coupled to a second mold 230 after curving into a first mold 205. The method of the third embodiment may include the following steps. The curved molding surface of the second mold 230, or the image sensor chip 105, may be pretreated and prepared for adhesion or bonding. For adhesion, methods of pre-treatment to promote adhesion may include, for example, oxygen plasma, chemical modification (e.g., silanization, deposition of acrylate monomers), mechanical roughening, or etching. A thermosetting polymer (e.g. epoxy), UV curable polymer (e.g., acrylate) or pressure sensitive adhesive may be applied to one or both surfaces, or a film adhesive may be applied to one or both surfaces, or a scrim or weave may be added to one or both surfaces. For solder bonding, methods to promote bonding may include, for example, mechanical roughening, etching, flux coating, or metal seed layer plating (with, e.g., Au). Solder or a low melting point metal or metallic alloy (e.g., a metal or alloy having a melting point below 250C, e.g., below 200C) may be applied to one or both surfaces.

The image sensor chip 105 and the magnetically responsive substrate 110, which may be coupled to the first or second surface of the image sensor chip 105, may then (FIG. 4A) be brought into proximity with the curved surface of the first mold 205. The surface of the first mold 205 may be treated with a chemical release agent or lubricant. A polymer film or weave may be placed between the sensor and curved molding surface to act as a non-stick surface or a contact barrier. The magnetic field may then (FIG. 4B) be engaged. This may be accomplished by (i) progressively increasing the voltage supplied to an electromagnet located at the back surface of the first mold 205, or (ii) increasing the voltage abruptly, or (iii) engaging the electromagnet first, followed by the magnetically responsive layer (whether within the imaging sensor or separate) being brought into closer proximity with the curved surface. Alternatively, a permanent magnet may be brought into close proximity with the back surface of the first mold 205, or the permanent magnet may be situated at the back surface of the first mold 205 and the magnetically responsive layer (whether within the imaging sensor or separate) may be brought into closer proximity with the curved surface. The separate magnetically responsive layer may then be released from the imaging sensor, if a separate magnetically responsive layer was used, and the curved surface of the second mold 230 (which forms a mating pair with the curved surface of the first mold 205) may then (FIG. 4C) be brought into contact with the free surface of the curved sensor.

Adhesion and bonding of the imaging sensor to the curved surface of the second mold 230 may be promoted, e.g., through heat, UV light, pressure (load) or a combination thereof. The magnet 210 may be disengaged, and the first mold 205 may be separated from the second mold 230 to reveal a curved sensor bonded or adhered to a curved mold. Disengagement of the field may be progressive or abrupt. A second adhesion and bonding promotion step, in which adhesion and bonding may be promoted through heat, UV light, pressure or combination thereof, may be performed. The magnet 210 and the first mold 205 may then be disengaged (FIG. 4D), exposing the light-sensitive surface 120 of the image sensor chip 105. If a magnetically responsive substrate 110 was coupled to the surface of the image sensor chip 105, it may be disengaged. FIGS. 5A-5D show a method similar to that of FIGS. 4A-4D, with, in FIG. 5A, the use of a membrane 505, which may be used to press (e.g., as a result of gas pressure on the upper side of the membrane 505) the image sensor chip 105 and the magnetically responsive substrate 110 against the first mold 205.

Figure 6A:
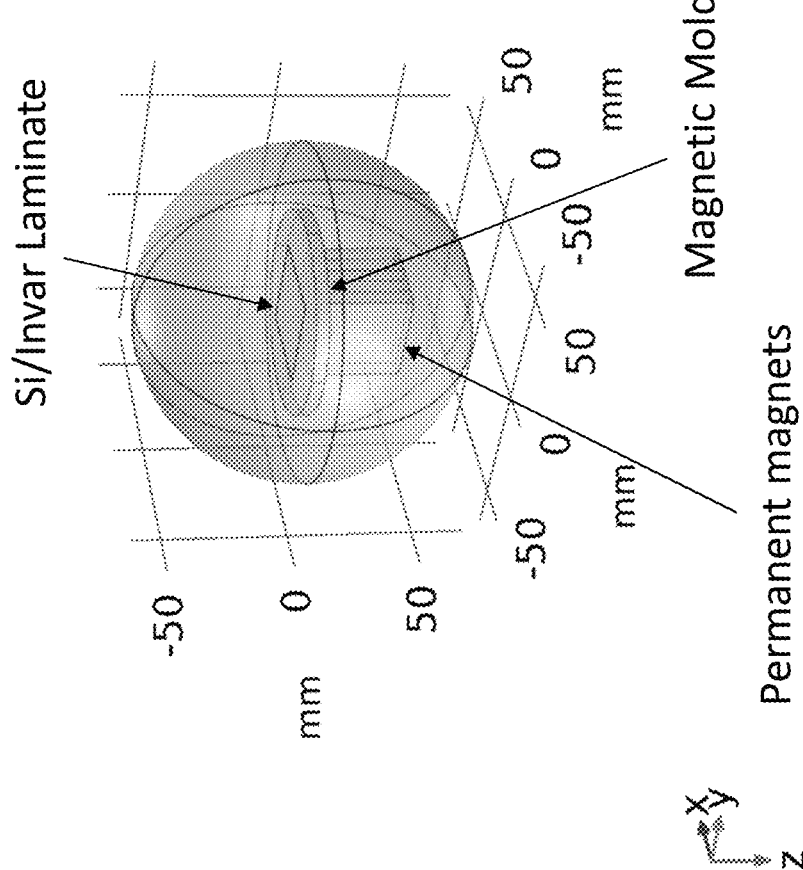
FIG. 6A is a perspective view of a geometry used to simulate magnetic fields, according to an embodiment of the present disclosure.
Figures 6B, 6C:
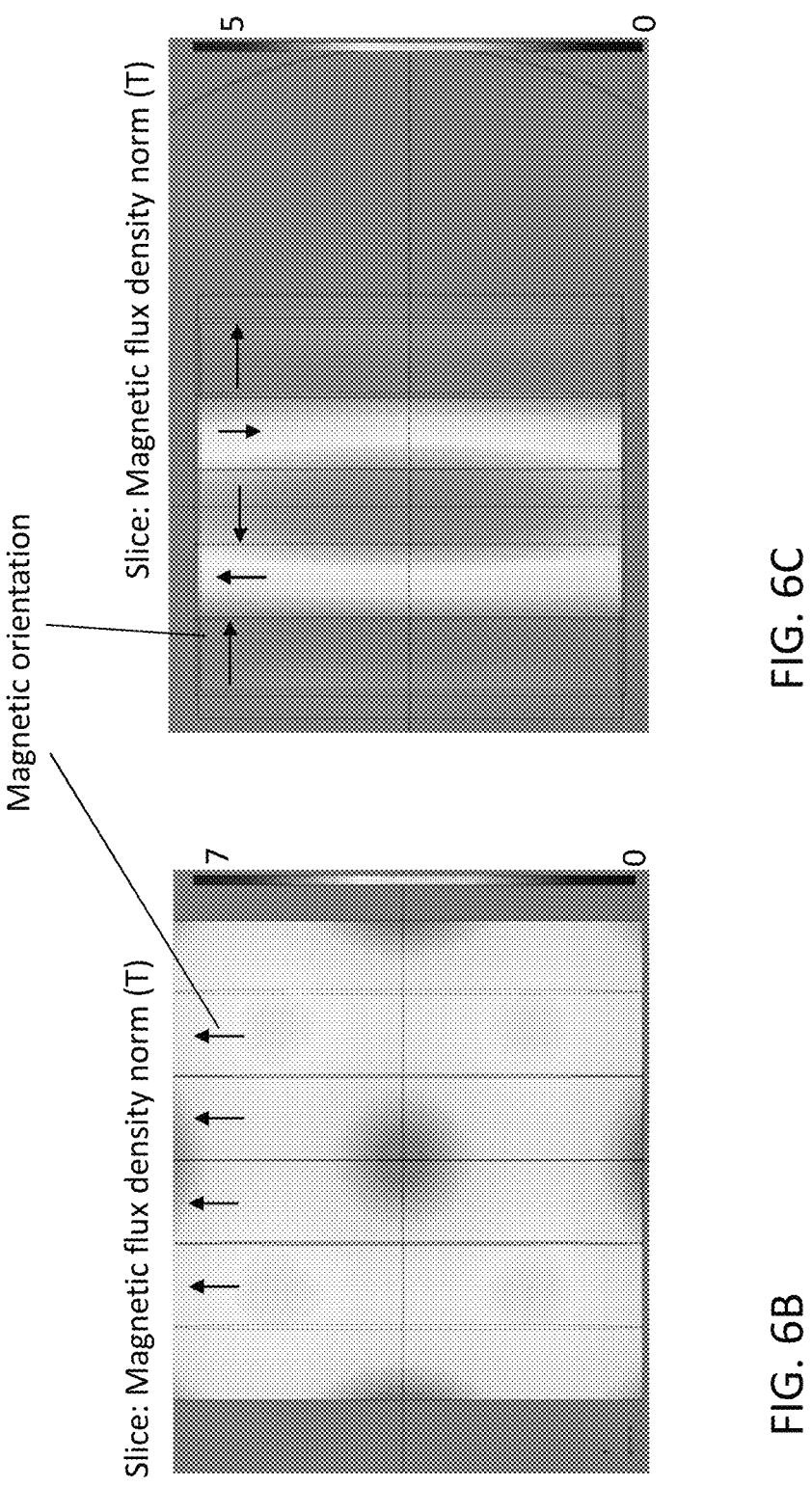
FIG. 6B is a graph of simulation results, according to an embodiment of the present disclosure.
FIG. 6C is a graph of simulation results, according to an embodiment of the present disclosure.
Figure 6D:
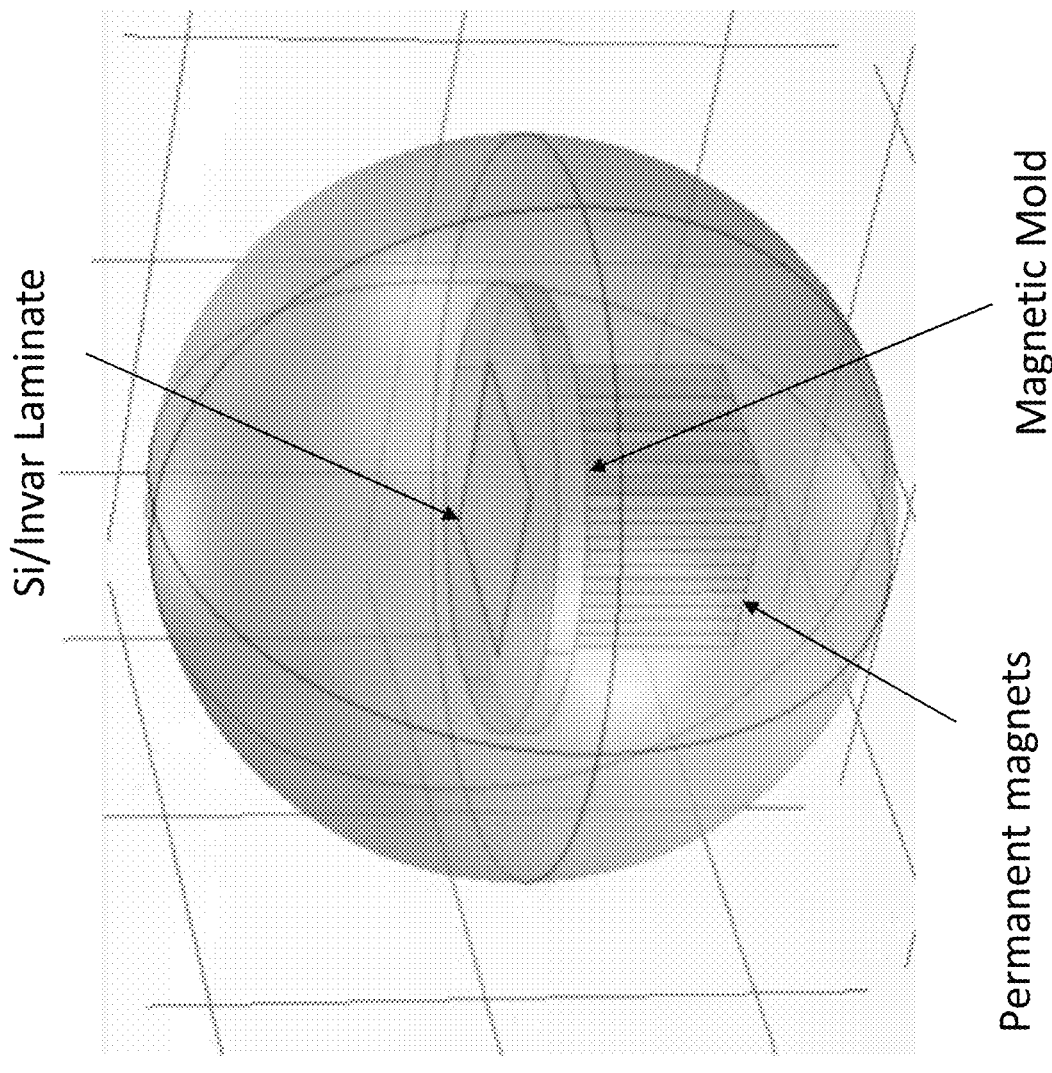
FIG. 6D is a perspective view of a geometry used to simulate magnetic fields, according to an embodiment of the present disclosure.
Figure 6E:
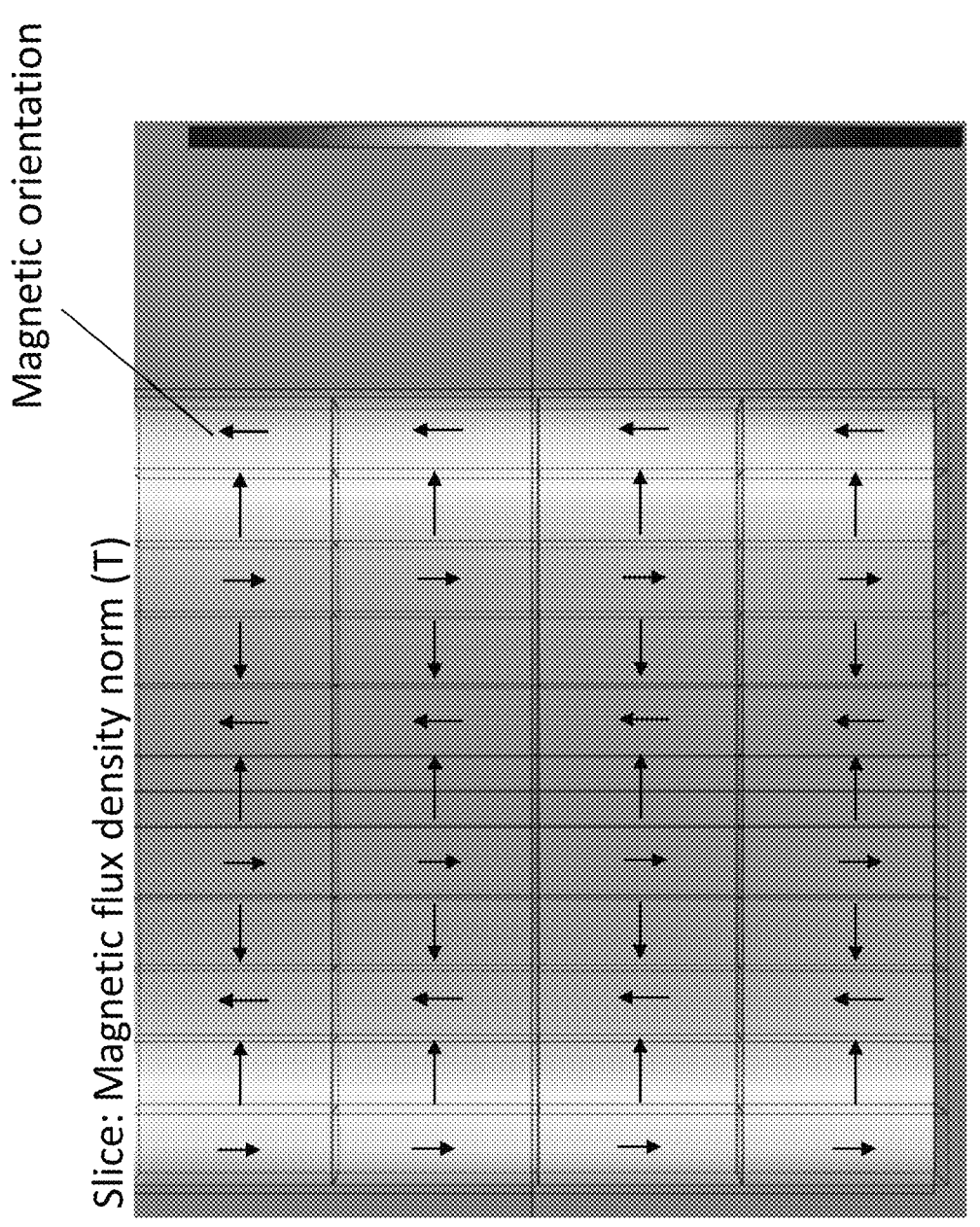
FIG. 6E is a graph of simulation results, according to an embodiment of the present disclosure.

FIG. 6A shows a first geometry used to simulate magnetic fields with an array of permanent magnets, and FIGS. 6B and 6C show simulation results, for cases in which the magnets are (FIG. 6B) all aligned in the same direction and (FIG. 6C) oriented in a progressive rotation. FIG. 6D shows a second geometry used to simulate magnetic fields with an array of permanent magnets, and FIG. 6E shows simulation results, for a case in which the magnets are oriented in a progressive rotation.

Figure 6F:
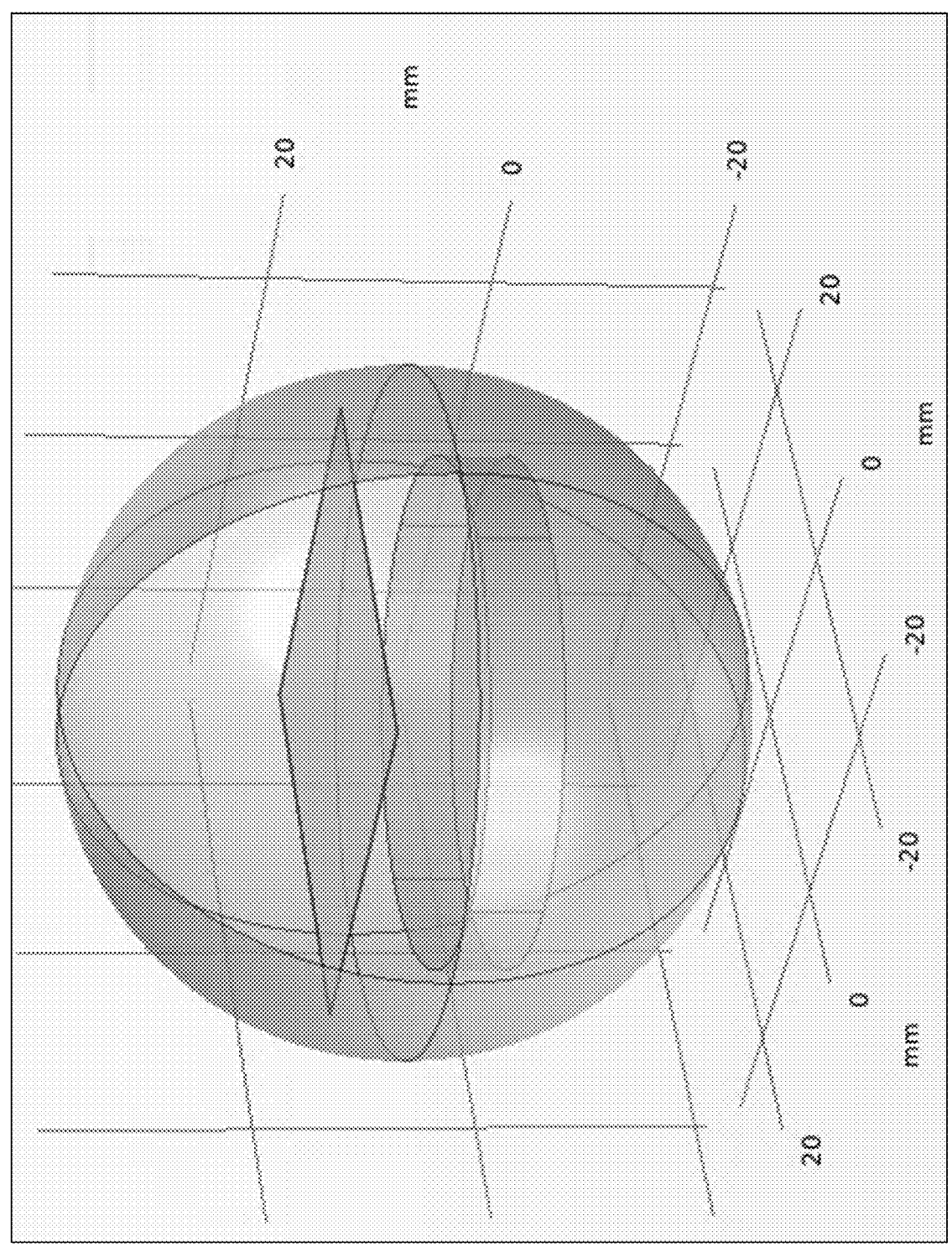
FIG. 6F is a perspective view of a geometry used to simulate magnetic fields, according to an embodiment of the present disclosure.
Figure 6G:
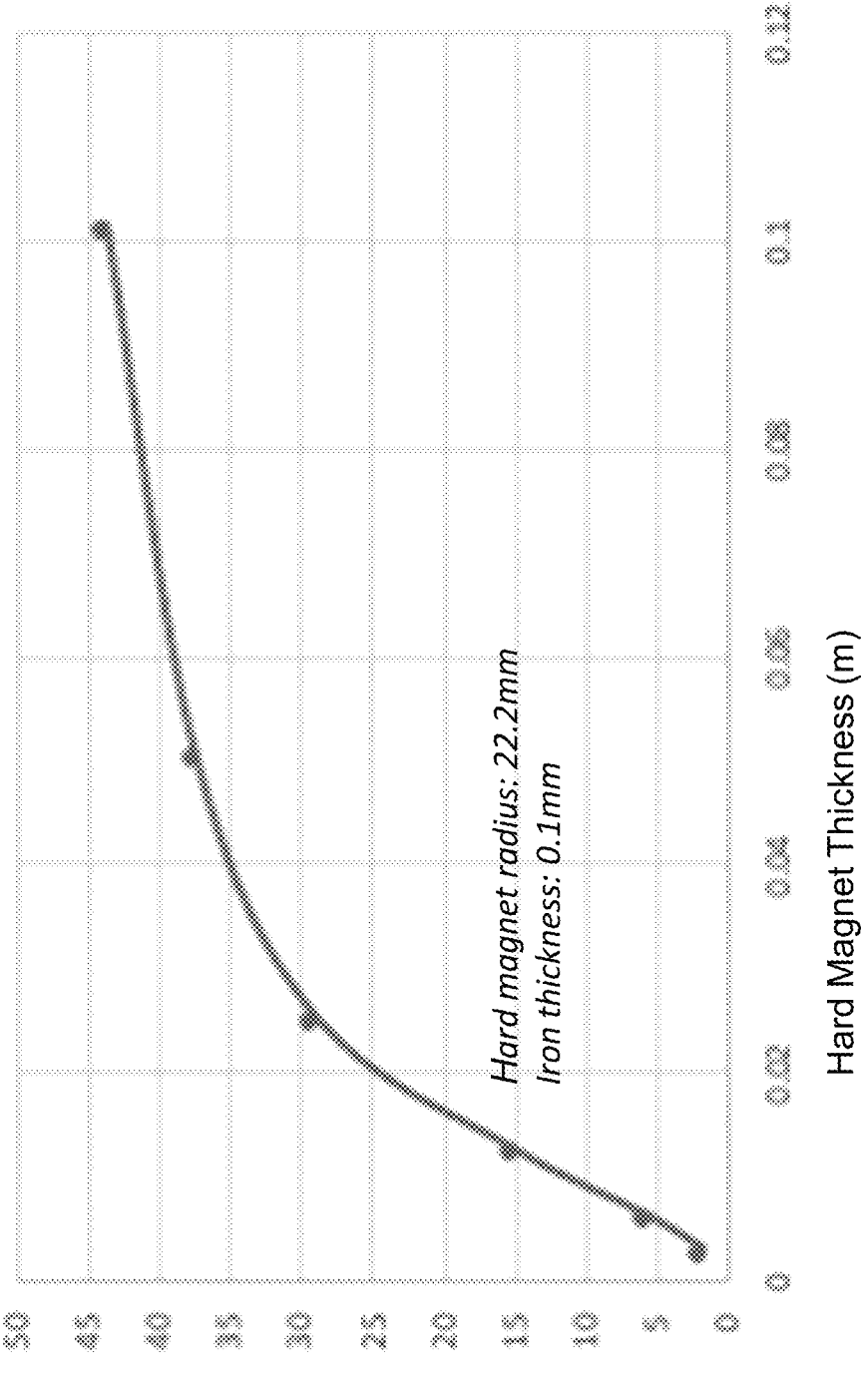
FIG. 6G is a graph of simulation results, according to an embodiment of the present disclosure.
Figure 6H:
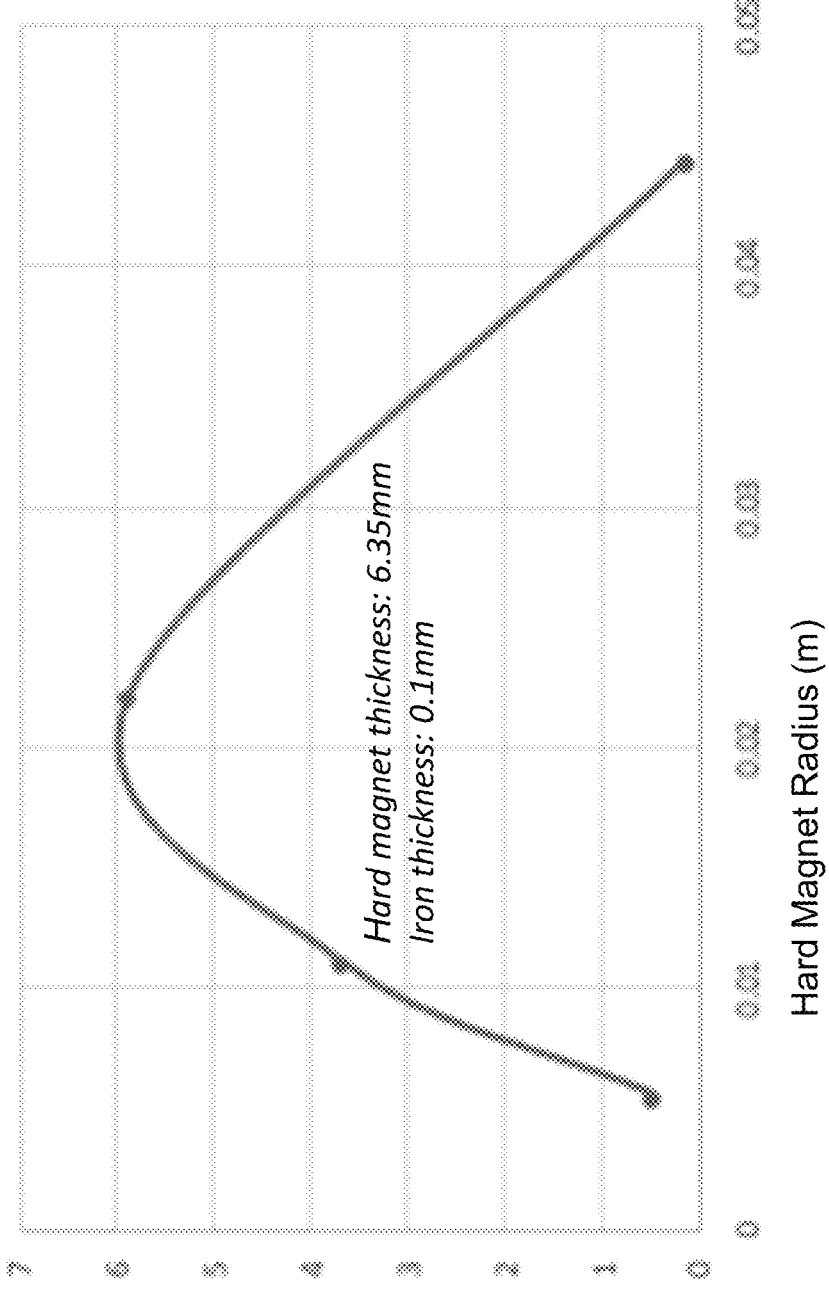
FIG. 6H is a graph of simulation results, according to an embodiment of the present disclosure.
Figure 61:
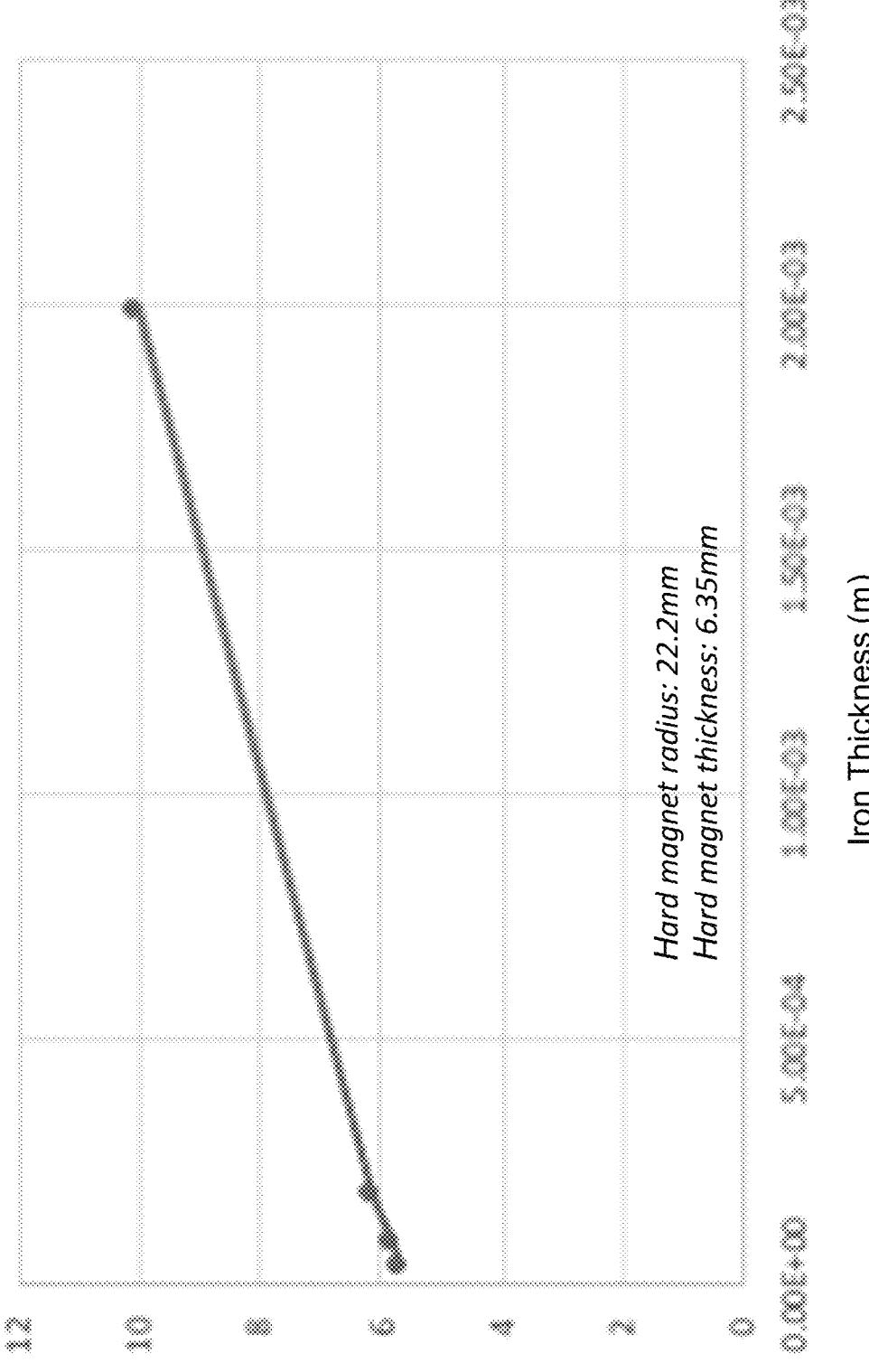
Figure 6J:
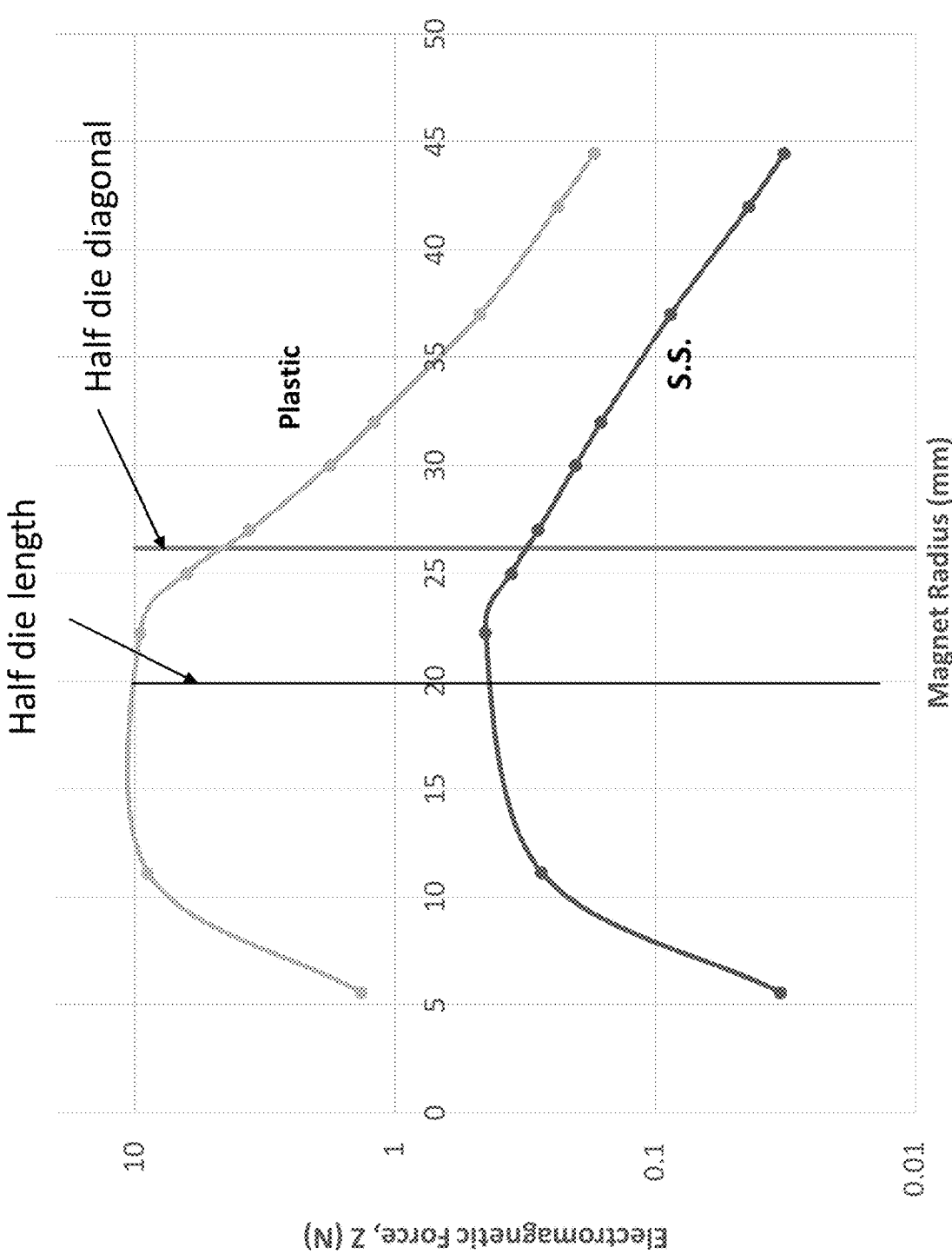
FIG. 6J is a graph of simulation results, according to an embodiment of the present disclosure.

The magnetically responsive layer 110 may be, as an example, a 37 mm×37 mm sheet of iron, and an N52 neodymium hard permanent magnet is used to apply a magnetic force to the magnetically responsive layer 110 (FIG. 6F). FIGS. 6G, 6H, and 6I shows the magnetic pull force on the magnetically responsive layer 110 as a function of (i) the thickness of the permanent magnet (FIG. 6G), of (ii) the radius of the permanent magnet (FIG. 6H), and of (iii) and the thickness of the magnetically responsive layer 110 (FIG. 6I). FIG. 6J shows an example magnetic pull force on the magnetically responsive layer 110 as a function of the radius of the permanent magnet for a first mold composed of an acrylic plastic "Plastic" or stainless steel "S.S.".

Figure 7A:
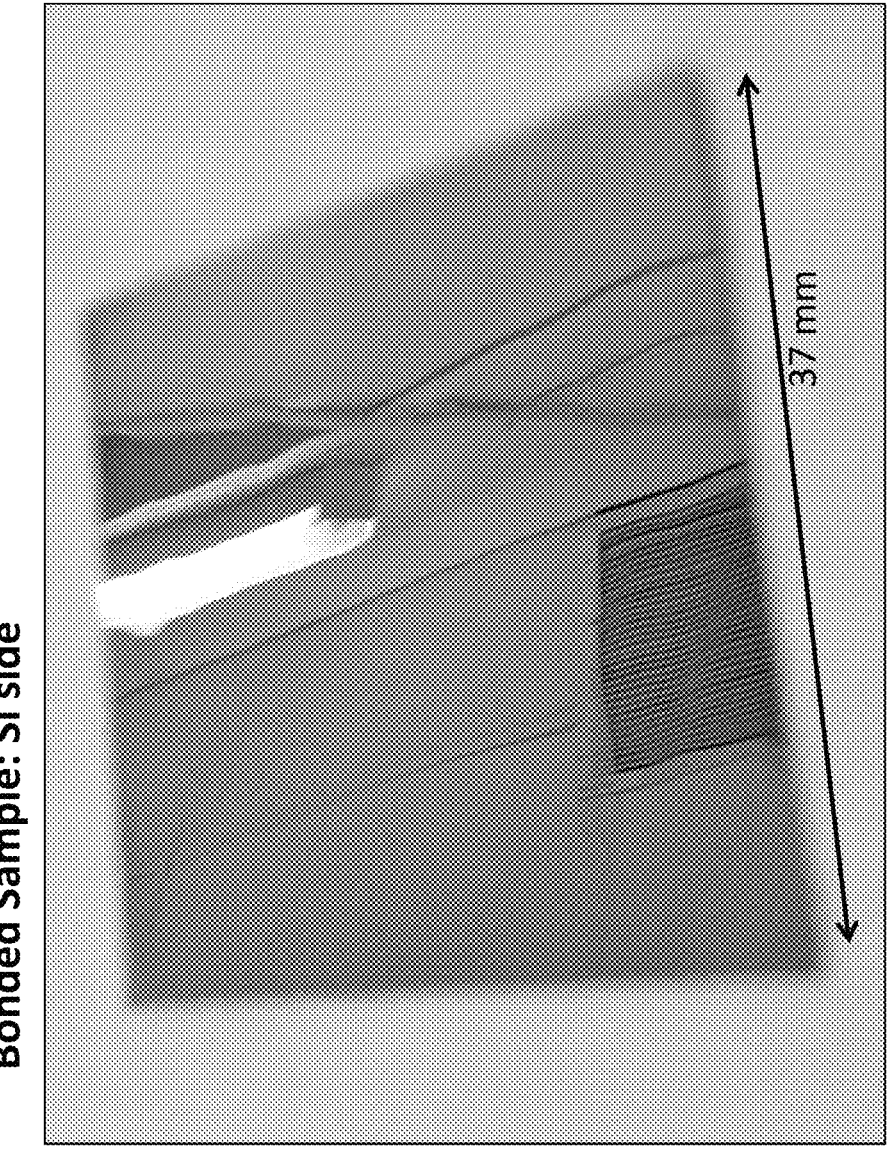
FIG. 7A is a photograph of a reduction to practice, according to an embodiment of the present disclosure.
Figure 7B:
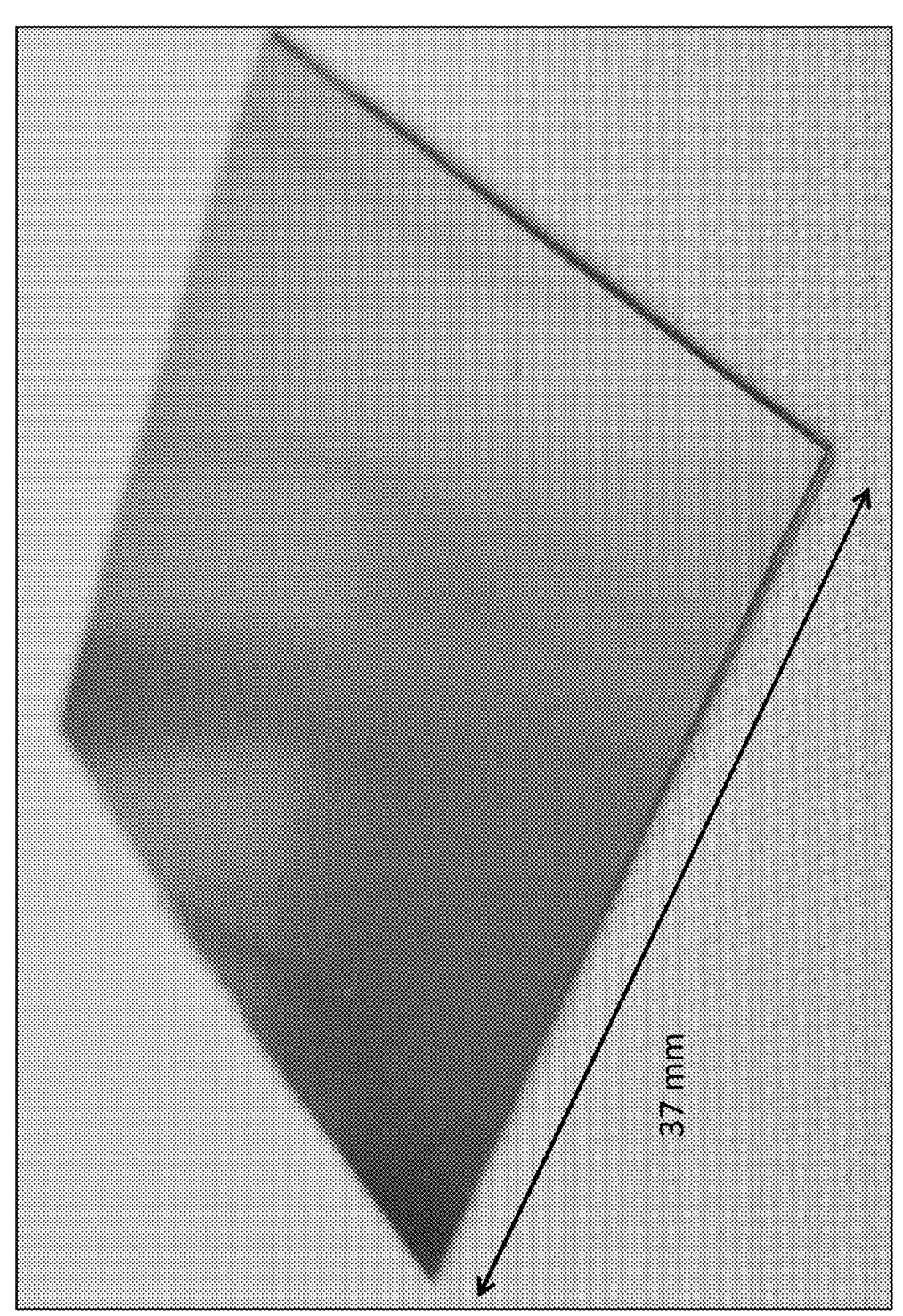
FIG. 7B is a photograph of a reduction to practice, according to an embodiment of the present disclosure.
Figure 7C:
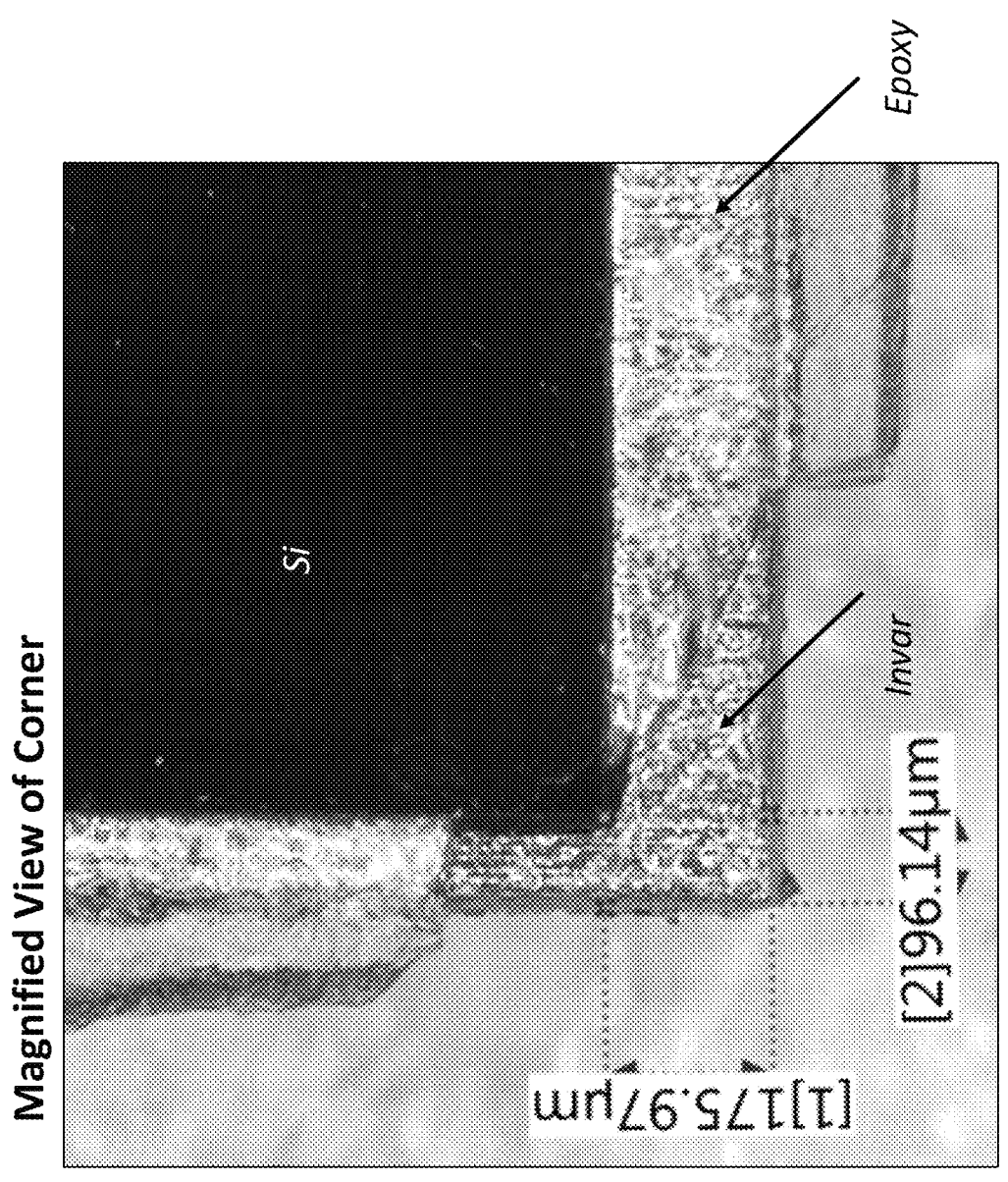
FIG. 7C is a photograph of a reduction to practice, according to an embodiment of the present disclosure.
Figure 7D:
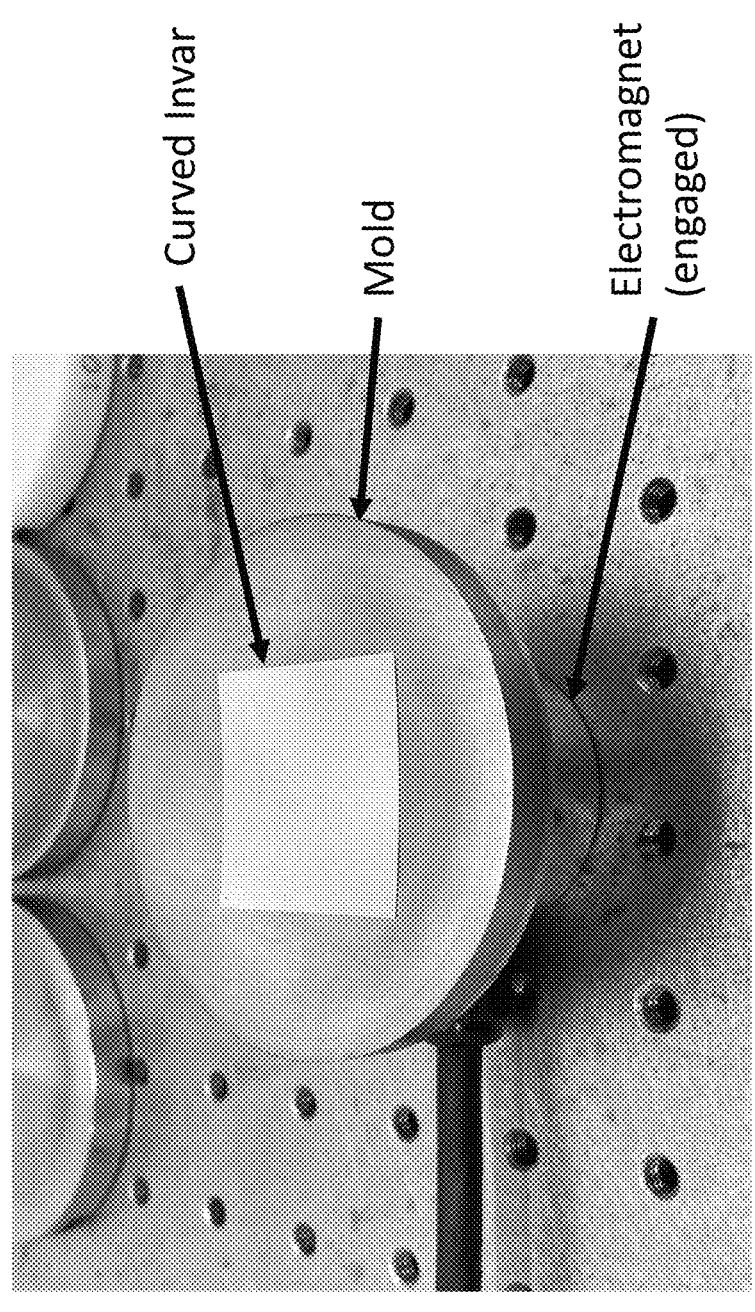
FIG. 7D is a photograph of a reduction to practice, according to an embodiment of the present disclosure.
Figure 7F:
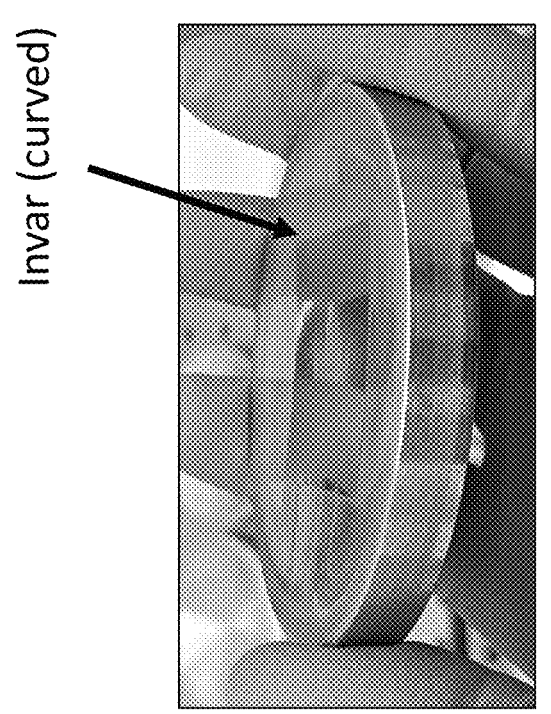
FIG. 7F is a photograph of a reduction to practice, according to an embodiment of the present disclosure.
Figure 7E:
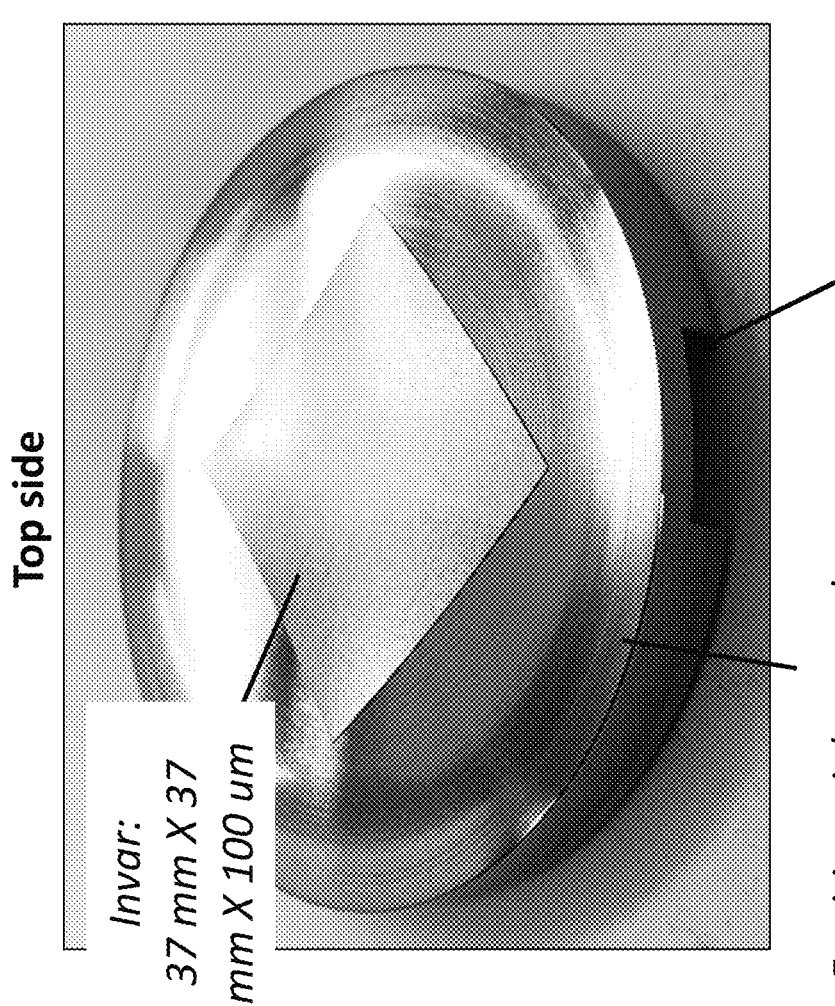
FIG. 7E is a photograph of a reduction to practice, according to an embodiment of the present disclosure.
Figure 7G:
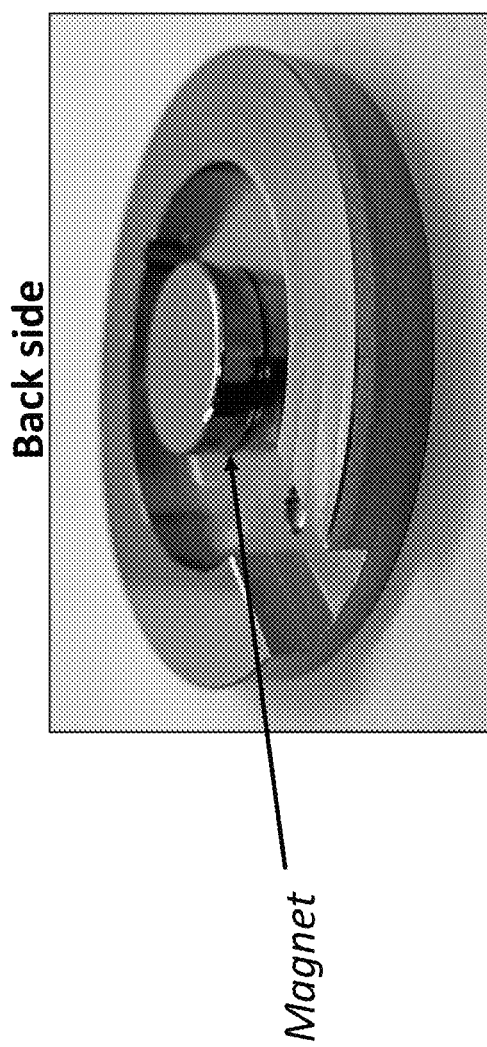
FIG. 7G is a photograph of a reduction to practice, according to an embodiment of the present disclosure.

FIGS. 7A-7C are photographs of a surrogate image sensor chip 105 bonded to an Invar 36 magnetically responsive substrate 110, with FIG. 7A showing the surrogate light-sensitive surface 120 of the image sensor chip 105, FIG. 7B showing the surface of the magnetically responsive substrate 110, and FIG. 7C showing a corner of the assembly. FIG. 7D shows a square sheet of Invar 36, bent into a curved shape by being pulled, by the magnetic field of an electromagnet, against the curved surface of a mold. FIGS. 7E and 7F show a square sheet of Invar 36, bent into a curved shape by being pulled, by the magnetic field of a permanent magnet, against the curved surface of a mold. FIG. 7G shows the back side of the mold of FIG. 7E, and the permanent magnet.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X−Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items. As used herein, any structure or layer that is described as being "made of" or "composed of" a substance should be understood (i) in some embodiments, to contain that substance as the primary component or (ii) in some embodiments, to contain that substance as the major component.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for magnetic curving of imaging sensors have been specifically described and illustrated herein, many modifications and variations will be apparent to those skilled in the art. Accordingly, it is to be understood that a system and method for magnetic curving of imaging sensors constructed according to principles of this disclosure may be embodied other than as specifically described herein. The invention is also defined in the following claims, and equivalents thereof.

What is claimed is:

1. An article, comprising:
   a semiconductor chip comprising an optical array detector; and
   a magnetic substrate coupled to the optical array detector,
   the optical array detector having a light-sensitive surface,
   the entire semiconductor chip being curved,
   the light-sensitive surface having a curvature of at least 1/m, wherein 1/m is the reciprocal of one meter.

2. The article of claim 1, wherein the optical array detector is a semiconductor chip.

3. The article of claim 1, wherein the optical array detector has a thickness greater than 10 microns and less than 400 microns.

4. The article of claim 1, wherein the light-sensitive surface has a Gaussian curvature of at least 1/m².

5. The article of claim 1, wherein the optical array detector is bonded to the magnetic substrate.

6. The article of claim 1, further comprising a mold having a curved surface, wherein the optical array detector and the magnetic substrate are conformed to the curved surface of the mold.

7. The article of claim 1, wherein:
   the optical array detector has a second surface, opposite the light-sensitive surface, and
   the magnetic substrate is on the second surface of the optical array detector.

8. The article of claim 7, further comprising a non-magnetic solid substrate, wherein the magnetic substrate is between the second surface of the optical array detector and a surface of the non-magnetic solid substrate.

9. The article of claim 1, further comprising a magnet, the magnet being configured to apply a force to the magnetic substrate, the force causing the optical array detector to have the curvature.

10. A method for constructing a detector assembly, the method comprising:
    applying a magnetic force to a magnetic substrate; and
    applying, by the magnetic substrate, in response to the magnetic force, a bending force to a semiconductor chip comprising an optical array detector,
    the bending force causing a light-sensitive surface of the optical array detector the entire semiconductor chip to have a curvature of at least 1/m, wherein 1/m is the reciprocal of one meter.

11. The method of claim 10, wherein the optical array detector is a semiconductor chip.

12. The method of claim 10, wherein the optical array detector has a thickness greater than 10 microns and less than 400 microns.

13. The method of claim 10, wherein the bending force further causes a light-sensitive surface of the optical array detector to have a Gaussian curvature of at least 1/m².

14. The method of claim 10, wherein the optical array detector is bonded to the magnetic substrate.

15. The method of claim 14, wherein:
    the optical array detector has a second surface, opposite a light-sensitive surface of the optical array detector, and
    the magnetic substrate is on the second surface of the optical array detector.

16. The method of claim 10, wherein the optical array detector is coupled to a non-magnetic solid substrate, and the non-magnetic solid substrate is coupled to the magnetic substrate.

17. The method of claim 10, wherein the applying of the magnetic force and the applying of the bending force comprises causing the magnetic substrate and the optical array detector to conform to a curved surface of a first mold.

18. A method for constructing a detector assembly, the method comprising:
    applying a magnetic force to a magnetic substrate;
    applying, by the magnetic substrate, in response to the magnetic force, a bending force to an optical array detector; and
    the bending force causing a light-sensitive surface of the optical array detector to have a curvature of at least 1/m,
    wherein:
       the applying of the magnetic force and the applying of the bending force comprises causing the magnetic substrate and the optical array detector to conform to a curved surface of a first mold, and
       the method further comprises transferring the optical array detector from the curved surface of the first mold to a curved surface of a second mold.

19. The method of claim 11, wherein the applying of the magnetic force comprises applying the magnetic force with a permanent magnet.

20. The method of claim 11, wherein the applying of the magnetic force comprises applying the magnetic force with an electromagnet.

* * * * *